(12) United States Patent
Hashimoto et al.

(10) Patent No.: US 10,090,149 B2
(45) Date of Patent: Oct. 2, 2018

(54) METHOD OF MANUFACTURING SEMICONDUCTOR DEVICE BY FORMING AND MODIFYING FILM ON SUBSTRATE

(71) Applicant: HITACHI KOKUSAI ELECTRIC INC., Tokyo (JP)

(72) Inventors: Yoshitomo Hashimoto, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/436,192

(22) Filed: Feb. 17, 2017

(65) Prior Publication Data

US 2017/0162386 A1  Jun. 8, 2017

Related U.S. Application Data

(63) Continuation of application No. PCT/JP2014/072006, filed on Aug. 22, 2014.

(51) Int. Cl.
| | |
|---|---|
| *H01L 21/31* | (2006.01) |
| *H01L 21/02* | (2006.01) |
| *C23C 16/40* | (2006.01) |
| *C23C 16/36* | (2006.01) |
| *C23C 16/32* | (2006.01) |
| *C23C 16/455* | (2006.01) |
| *C23C 16/52* | (2006.01) |

(52) U.S. Cl.
CPC ...... *H01L 21/02323* (2013.01); *C23C 16/325* (2013.01); *C23C 16/36* (2013.01); *C23C 16/401* (2013.01); *C23C 16/45529* (2013.01); *C23C 16/45544* (2013.01); *C23C 16/52* (2013.01); *H01L 21/02164* (2013.01); *H01L 21/02337* (2013.01); *H01L 21/0214* (2013.01); *H01L 21/02126* (2013.01); *H01L 21/02167* (2013.01)

(58) Field of Classification Search
None
See application file for complete search history.

(56) References Cited

U.S. PATENT DOCUMENTS

2014/0342573 A1*  11/2014  Hirose .................. C23C 16/36
                                                                      438/761

FOREIGN PATENT DOCUMENTS

| WO | 2012/128044 A1 | 9/2012 |
| WO | 2013/027549 A1 | 2/2013 |

OTHER PUBLICATIONS

Japanese Office Action dated May 25, 2017 in the Japanese Application No. 2016-543777.
International Search Report, PCT/JP2014/072006, dated Nov. 11, 2014, 3 pgs. (Japanese and English languages).

* cited by examiner

*Primary Examiner* — Cory Eskridge
(74) *Attorney, Agent, or Firm* — Volpe and Koenig, P.C.

(57) ABSTRACT

A method of manufacturing a semiconductor device includes: forming a base film containing a first element and carbon on a substrate by supplying a film forming gas to the substrate; and oxidizing the base film by supplying an oxidizing gas to the substrate to modify the base film into a C-free oxide film containing the first element.

13 Claims, 10 Drawing Sheets

METHOD OF MANUFACTURING SEMICONDUCTOR DEVICE BY FORMING AND MODIFYING FILM ON SUBSTRATE

CROSS-REFERENCE TO RELATED APPLICATION(S)

This application is a bypass continuation application of international application No. PCT/JP2014/072006 having an international filing date of Aug. 22, 2014 and designating the United States, the entire contents of which are incorporated herein by reference.

TECHNICAL FIELD

The present disclosure relates to a method of manufacturing a semiconductor device.

BACKGROUND

As an example of processes of manufacturing a semiconductor device, a process of forming an oxide film on a substrate is often carried out by performing a step of forming a base film by supplying a film forming gas to the substrate and a step of modifying the base film by supplying an oxidizing gas to the substrate.

SUMMARY

By adding carbon (C) as an impurity into the above-mentioned oxide film, it is possible to improve an etching resistance of the film. However, when C is added to the oxide film, a dielectric constant of the film may be increased and a leak resistance of the film may be decreased. The present disclosure provides some embodiments of a technique capable of forming an oxide film having a low impurity concentration and an excellent etching resistance.

According to one embodiment of the present disclosure, there is provided a method of manufacturing a semiconductor device, including: forming a base film containing a first element and carbon on a substrate by supplying a film forming gas to the substrate; and oxidizing the base film by supplying an oxidizing gas to the substrate to modify the base film into a C-free oxide film containing the first element.

DETAILED DESCRIPTION

<One Embodiment of the Present Disclosure>

One embodiment of the present disclosure will now be described with reference to FIGS. 1 to 3.

(1) Configuration of Substrate Processing Apparatus

Figure 1:
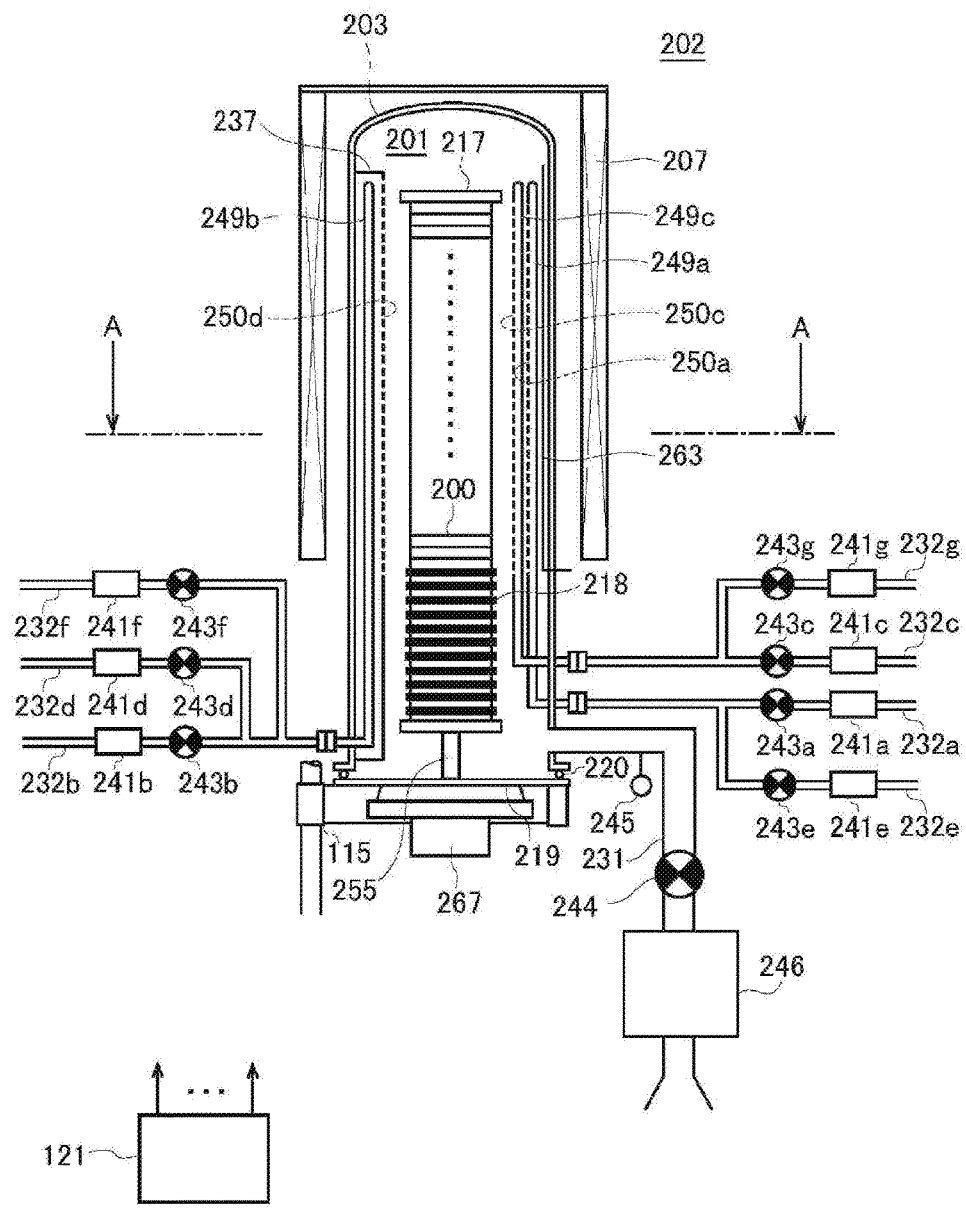
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating means (a heating mechanism). The heater 207 has a cylindrical shape and is supported by a heater base (not shown) serving as a support plate so as to be vertically installed. As will be described later, the heater 207 functions also as an excitation part (an activation mechanism) configured to thermally excite (activate) a gas.

A reaction tube 203 constituting a reaction vessel (a process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates. The wafers 200 are horizontally stacked at multiple stages along a vertical direction in a boat 217 which will be described later.

Nozzles 249a to 249c are installed inside the process chamber 201 so as to penetrate through the lower part of the reaction tube 203. The nozzles 249a to 249c are made of, e.g., a heat resistant material such as quartz, SiC or the like. Gas supply pipes 232a to 232c are respectively connected to the nozzles 249a to 249c. A gas supply pipe 232d is connected to the gas supply pipe 232b. In this way, the three nozzles 249a to 249c and the four gas supply pipes 232a to 232d are installed in the reaction tube 203, thereby allowing plural kinds of gases to be supplied into the process chamber 201.

However, the processing furnace 202 of this embodiment is not limited to the above-described form. For example, a metal manifold may be installed under the reaction tube 203 so as to support the reaction tube 203 and each of the nozzles may be installed to penetrate through the sidewall of the manifold. In this case, an exhaust pipe 231 to be described later may be further installed in the manifold. Even in this case, the exhaust pipe 231 may be installed under the reaction tube 203 rather than the manifold. In this way, a furnace opening of the processing furnace 202 may be made of metal and the nozzles and so on may be installed in the metal furnace opening.

Mass flow controllers (MFCs) 241a to 241d, which are flow rate controllers (flow rate control parts), and valves 243a to 243d, which are opening/closing valves, are installed in the gas supply pipes 232a to 232d sequentially from the corresponding upstream sides, respectively. Gas supply pipes 232e to 232g, which supply an inert gas, are respectively connected to the gas supply pipes 232a to 232c at the downstream side of the valves 243a to 243c. MFCs 241e to 241g, which are flow rate controllers (flow rate control parts), and valves 243e to 243g, which are opening/closing valves, are installed in the gas supply pipes 232e to 232g sequentially from the corresponding upstream sides, respectively.

The nozzles 249a and 249c are respectively connected to front end portions of the gas supply pipes 232a and 232c. As shown in FIG. 2, the nozzles 249a and 249c are disposed in an annular space between the inner wall of the reaction tube 203 and the wafers 200 such that the nozzles 249a and 249c extend upward along a stack direction of the wafers 200 from a lower portion of the inner wall of the reaction tube 203 to an upper portion thereof. Specifically, the nozzles 249a and 249c are installed in a region horizontally surrounding a wafer arrangement region in which the wafers 200 are arranged at a lateral side of the wafer arrangement region, along the wafer arrangement region. That is, the nozzles 249a and 249c are installed in a perpendicular relationship with the surfaces (flat surfaces) of the wafers 200 at a lateral side of the end portions (peripheral edge portions) of the wafers 200, which are carried into the process chamber 201. The nozzles 249a and 249c are configured as an L-shaped long nozzle. A horizontal portion of each of the nozzles 249a and 249c is installed to penetrate through the lower sidewall of the reaction tube 203. A vertical portion of each of the nozzles 249a and 249c is installed to extend upward at least from one end portion of the wafer arrangement region toward the other end portion thereof. Gas supply holes 250a and 250c for supplying a gas are respectively formed on the side surfaces of the nozzles 249a and 249c. The gas supply holes 250a and 250c are opened toward the center of the reaction tube 203 to allow the gas to be supplied toward the wafers 200. A plurality of gas supply holes 250a and 250c may be formed between the lower portion of the reaction tube 203 and the upper portion thereof. The plurality of gas supply holes 250a and 250c may be formed to have the same aperture area at the same aperture pitch.

The nozzle 249b is connected to a front end portion of the gas supply pipe 232b. The nozzle 249b is disposed in a buffer chamber 237 serving as a gas supply part. The buffer chamber 237 serves also as a gas dispersion space. The buffer chamber 237 is disposed in the annular space between the inner wall of the reaction tube 203 and the wafers 200 along the stack direction of the wafers 200 from the lower portion of the inner wall of the reaction tube 203 to the upper portion thereof. Specifically, the buffer chamber 237 is installed in the region horizontally surrounding the wafer arrangement region at the lateral side of the wafer arrangement region along the wafer arrangement region. That is, the buffer chamber 237 is installed at the lateral side of the end portions of the wafers 200, which are carried into the process chamber 201. A gas supply hole 250d for supplying a gas is formed in an end portion of a wall of the buffer chamber 237 which is adjacent to the wafers 200. The gas supply hole 250d is opened toward the center of the reaction tube 203 to allow the gas to be supplied toward the wafers 200. A plurality of gas supply holes 250d may be formed between the lower portion of the reaction tube 203 and the upper portion thereof. The plurality of gas supply holes 250d may be formed to have the same aperture area at the same aperture pitch.

The nozzle 249b is installed at an end portion of the buffer chamber 237, which is in the opposite side to the end portion at which the gas supply hole 250d is formed, so as to extend upward along the stack direction of the wafers 200 from the lower portion of the inner wall of the reaction tube 203 to the upper portion thereof. Specifically, the nozzle 249b is installed in the region horizontally surrounding the wafer arrangement region in which the wafers 200 are arranged at the lateral side of the wafer arrangement region, along the wafer arrangement region. That is, the nozzle 249b is installed in a perpendicular relationship with the surfaces of the wafers 200 at the lateral side of the end portions of the wafers 200, which are carried into the process chamber 201. The nozzle 249b is configured as an L-shaped long nozzle. A horizontal portion of the nozzle 249b is installed to penetrate through the lower sidewall of the reaction tube 203. A vertical portion of the nozzle 249b is installed to extend upward at least from one end portion of the wafer arrangement region toward the other end portion thereof. A gas supply hole 250b for supplying a gas is formed on the side surface of the nozzle 249b. The gas supply hole 250b is opened toward the center of the buffer chamber 237. Like the gas supply hole 250d, a plurality of gas supply holes 250b may be formed between the lower portion of the reaction tube 203 and the upper portion thereof. If a difference between the internal pressure of the buffer chamber 237 and the internal pressure of the process chamber 201 is small, the plurality of gas supply holes 250b may be formed to have the same aperture area at the same aperture pitch over a range from the upstream side (lower portion) to the downstream side (upper portion). If the difference between the internal pressure of the buffer chamber 237 and the internal pressure of the process chamber 201 is large, the plurality of gas supply holes 250b may be formed to have an aperture area which gradually increases from the upstream side to the downstream side or may be formed to have an aperture pitch which gradually decreases from the upstream side to the downstream side.

By adjusting the aperture area and the aperture pitch of each of the gas supply holes 250b over a range from the upstream side to the downstream side as described above, it is possible to eject a gas with substantially the same flow rate from each of the gas supply holes 250b although it has a difference in flow velocity. Then, once by introducing the gas, which is ejected from the gas supply holes 250b, into the buffer chamber 237, it is possible to eliminate a difference in gas flow velocity in the buffer chamber 237. The gas ejected from the gas supply holes 250b into the buffer chamber 237 is mitigated in terms of its particle velocity in the buffer chamber 237 and then is ejected into the process chamber 201 through the gas supply holes 250d. The gas ejected from the gas supply holes 250b into the buffer chamber 237 has a uniform flow rate and flow velocity when it is ejected into the process chamber 201 through the gas supply holes 250d.

As described above, in this embodiment, a gas is transferred through the nozzles 249a to 249c and the buffer chamber 237, which are disposed in the vertically-elongated annular space, i.e., a cylindrical space, defined by the inner surface of the side wall of the reaction tube 203 and the end portions (peripheral edge portions) of the wafers 200 arranged in the reaction tube 203. The gas is initially injected into the reaction tube 203, near the wafers 200, through the gas supply holes 250a to 250d formed respectively in the nozzles 249a to 249c and the buffer chamber 237. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve film thickness uniformity of a film formed on each of the wafers 200. In addition, the gas flowing on the surfaces of the wafers 200 after reaction, i.e., a residual gas remaining after reaction, flows toward an exhaust port, i.e., the exhaust pipe 231 which will be described later. The flow direction of the residual gas is not limited to a vertical direction but may be appropriately varied depending on a position of the exhaust port.

A precursor gas containing a first element, for example, a halosilane precursor gas containing silicon (Si) as the first element and a halogen element, is supplied from the gas supply pipe 232a into the process chamber 201 via the MFC 241a, the valve 243a and the nozzle 249a.

The halosilane precursor gas refers to a gaseous halosilane precursor, for example, a gas obtained by vaporizing a halosilane precursor which remains in a liquid state under room temperature and atmospheric pressure, or a halosilane precursor which remains in a gas state under room temperature and atmospheric pressure. The halosilane precursor refers to a silane precursor having a halogen group. The halogen group includes a chloro group, a fluoro group, a bromo group and an iodine group. That is, the halogen group contains halogen elements such as chlorine (Cl), fluorine (F), bromine (Br) and iodine (I). The halosilane precursor may be said to be one kind of halide. When the term "precursor" is used herein, it may refer to "a liquid precursor staying in a liquid state," "a precursor gas staying in a gaseous state," or both.

As the halosilane precursor gas, it may be possible to use, e.g., a precursor gas containing Si and Cl, namely, a chlorosilane precursor gas. As the chlorosilane precursor gas, it may be possible to use, e.g., a hexachlorodisilane ($Si_2Cl_6$, abbreviation: HCDS) gas.

In the case of using a liquid precursor, such as HCDS, which stays in a liquid state under room temperature and atmospheric pressure, the liquid precursor is vaporized by a vaporization system such as a vaporizer or a bubbler and is supplied as a precursor gas (an HCDS gas).

A reaction gas containing a second element differing from the above-mentioned first element, for example, an oxygen (O)-containing gas, is supplied from the gas supply pipe 232b into the process chamber 201 via the MFC 241b, the valve 243b, the nozzle 249b and the buffer chamber 237. The O-containing gas acts as an oxidizing gas, namely, an O source, in a substrate processing process which will be described later. As the O-containing gas, it may be possible to use, e.g., an oxygen ($O_2$) gas.

Alternatively, a reaction gas containing a second element differing from the above-mentioned first element, for example, a nitrogen (N)-containing gas, may be supplied from the gas supply pipe 232b into the process chamber 201 via the MFC 241b, the valve 243b, the nozzle 249b and the buffer chamber 237. As the N-containing gas, it may be possible to use, e.g., a hydrogen nitride-based gas. The hydrogen nitride-based gas may also be referred to as a material composed of only two elements, N and H, and acts as a nitriding gas, namely, an N source, in the substrate processing process which will be described later. As the hydrogen nitride-based gas, it may be possible to use, e.g., an ammonia ($NH_3$) gas.

Alternatively, a reaction gas containing a second element differing from the above-mentioned first element, for example, a nitrogen (N) and carbon (C)-containing gas, may be supplied from the gas supply pipe 232b into the process chamber 201 via the MFC 241b, the valve 243b, the nozzle 249b and the buffer chamber 237. As the N and C-containing gas, it may be possible to use, e.g., an amine-based gas.

The amine-based gas is a gaseous amine gas, e.g., a gas which is obtained by vaporizing amine which is in a liquid state under room temperature and atmospheric pressure or a gas which contains an amine group such as amine or the like staying in a gaseous state under room temperature and atmospheric pressure. The amine-based gas contains amine such as ethylamine, methylamine, propylamine, isopropylamine, butylamine, isobutylamine, or the like. As used herein, the term "amine" is a generic name of compounds in which hydrogen (H) of ammonia ($NH_3$) is substituted with a hydrocarbon group such as an alkyl group or the like. Amine contains a hydrocarbon group such as an alkyl group or the like as a ligand containing C, namely an organic ligand. The amine-based gas may be referred to as a Si-free gas since it contains three elements C, N and H while not containing Si. The amine-based gas may also be referred to as a Si-free and metal-free gas since it does not contain Si and metal. Namely, the amine-based gas may be referred to as a substance consisting of only three elements C, N and H. The amine-based gas acts as an N source and as a C source in the substrate processing process which will be described later. When the term "amine" is used herein, it may refer to "amine staying in a liquid state," "an amine-based gas staying in a gaseous state," or both.

As the amine-based gas, it may be possible to use, e.g., a triethylamine (($C_2H_5$)$_3$N, abbreviation: TEA) gas, in which the number of C-containing ligands (ethyl groups) in the chemical structural formula (in one molecule) is two or more and the number of C atoms in one molecule is larger than the number of N atoms. In the case of using amine such as TEA which is in a liquid state under room temperature and atmospheric pressure, the amine in a liquid state is vaporized by a vaporization system such as a vaporizer or a bubbler, and is supplied as an amine-based gas (a TEA gas).

Alternatively, a reaction gas containing a second element differing from the above-mentioned first element, for example, a boron (B)-containing gas, may be supplied from the gas supply pipe 232b into the process chamber 201 via the MFC 241b, the valve 243b, the nozzle 249b and the buffer chamber 237. As the B-containing gas, it may be possible to use, e.g., a borane-based gas.

The borane-based gas is a gaseous borane compound, e.g., a gas which is obtained by vaporizing a borane compound which is in a liquid state under room temperature and atmospheric pressure, or a borane compound which stays in a gaseous state under room temperature and atmospheric pressure. The borane compound includes a haloborane compound containing B and a halogen element, for example, a chloroborane compound containing B and Cl. In addition, the borane compound includes borane (boron hydride) such as monoborane ($BH_3$) and diborane ($B_2H_6$), and a borane compound (borane derivative) in which H in borane is substituted with another element. The borane-based gas acts as a B source in the substrate processing process which will be described later. As the borane-based gas, it may be possible to use, e.g., a trichloroborane ($BCl_3$) gas.

A reaction gas containing a second element differing from the above-mentioned first element, for example, a hydrogen (H)-containing gas, is supplied from the gas supply pipe 232c into the process chamber 201 via the MFC 241c, the valve 243c and the nozzle 249c. The H-containing gas cannot obtain an oxidizing effect by itself. However, in the substrate processing process which will be described later, the H-containing gas generates oxidizing species such as atomic oxygen (O) by reacting with an O-containing gas under specific conditions and acts to improve the efficiency of oxidation. Therefore, the H-containing gas may be considered to be included in the oxidizing gas, like the O-containing gas. As the H-containing gas, it may be possible to use, e.g., a hydrogen ($H_2$) gas.

A reaction gas containing a second element differing from the above-mentioned first element, for example, a carbon (C)-containing gas, is supplied from the gas supply pipe 232d into the process chamber 201 via the MFC 241d, the valve 243d, the gas supply pipe 232b, the nozzle 249b and the buffer chamber 237. As the C-containing gas, it may be possible to use, e.g., a hydrogen carbide-based gas. The hydrogen carbide-based gas may also be referred to as a material composed of only two elements, C and H, and acts as a C source, in the substrate processing process which will be described later. As the hydrogen carbide-based gas, it may be possible to use, e.g., a propylene ($C_3H_6$) gas.

An inert gas, for example, a nitrogen ($N_2$) gas, is supplied from the gas supply pipes 232e to 232g into the process chamber 201 via the MFCs 241e to 241g, the valves 243e to 243g, the gas supply pipes 232a to 232c, the nozzles 249a to 249c and the buffer chamber 237. The inert gas supplied from the gas supply pipes 232e to 232g acts as a purge gas, a dilution gas or a carrier gas.

In the case of supplying the above-mentioned precursor gas from the gas supply pipe 232a, a precursor gas supply system is mainly configured by the gas supply pipe 232a, the MFC 241a and the valve 243a. The precursor gas supply system may also include the nozzle 249a. The precursor gas supply system may be referred to as a precursor supply system. In the case of supplying the halosilane precursor gas from the gas supply pipe 232a, the precursor supply system may be referred to as a halosilane precursor gas supply system or a halosilane precursor supply system.

In the case of supplying the O-containing gas from the gas supply pipe 232b, an O-containing gas supply system is mainly configured by the gas supply pipe 232b, the MFC 241b and the valve 243b. The O-containing gas supply system may also include the nozzle 249b and the buffer chamber 237. The O-containing gas supply system may be referred to as an oxidizing gas supply system or an oxidizing agent supply system.

In the case of supplying the N-containing gas from the gas supply pipe 232b, an N-containing gas supply system is mainly configured by the gas supply pipe 232b, the MFC 241b and the valve 243b. The N-containing gas supply system may also include the nozzle 249b and the buffer chamber 237. The N-containing gas supply system may be referred to as a nitriding gas supply system or a nitriding agent supply system. In the case of supplying the hydrogen nitride-based gas from the gas supply pipe 232b, the N-containing gas supply system may be referred to as a hydrogen nitride-based gas supply system or a hydrogen nitride supply system.

In the case of supplying the N and C-containing gas from the gas supply pipe 232b, an N and C-containing gas supply system is mainly configured by the gas supply pipe 232b, the MFC 241b and the valve 243b. The N and C-containing gas supply system may also include the nozzle 249b and the buffer chamber 237. In the case of supplying the amine-based gas from the gas supply pipe 232b, the N and C-containing gas supply system may be referred to as an amine-based gas supply system or an amine supply system. Since the N and C-containing gas is both an N-containing gas and a C-containing gas, the N and C-containing gas supply system may be included in an N-containing gas supply system and a C-containing gas supply system which will be described later.

In the case of supplying the B-containing gas from the gas supply pipe 232b, a B-containing gas supply system is mainly configured by the gas supply pipe 232b, the MFC 241b and the valve 243b. The B-containing gas supply system may also include the nozzle 249b and the buffer chamber 237. In the case of supplying the borane-based gas from the gas supply pipe 232b, the B-containing gas supply system may be referred to as a borane-based gas supply system or a borane compound supply system.

In the case of supplying the H-containing gas from the gas supply pipe 232c, an H-containing gas supply system is mainly configured by the gas supply pipe 232c, the MFC 241c and the valve 243c. The H-containing gas supply system may also include the nozzle 249c. In the case of supplying the H-containing gas from the gas supply pipe 232c while supplying the O-containing gas from the gas supply pipe 232b, the H-containing gas supply system may be included in the above-mentioned oxidizing gas supply system.

In the case of supplying the C-containing gas from the gas supply pipe 232d, a C-containing gas supply system is mainly configured by the gas supply pipe 232d, the MFC 241d and the valve 243d. The downstream side of the gas supply pipe 232b from a connection with the gas supply pipe 232d, the nozzle 249b and the buffer chamber 237 may be included in the C-containing gas supply system. In the case of supplying the hydrogen carbide-based gas from the gas supply pipe 232d, the C-containing gas supply system may be referred to as a hydrogen carbide-based gas supply system or a hydrogen carbide supply system.

Among the various gases supplied from the above-described gas supply systems, one or all of the gases used in a base film forming step which will be described later may be referred to as a film forming gas. Among the above-described gas supply systems, one or all of the gas supply systems used in the base film forming step which will be described later may be referred to as a film forming gas supply system. Among the above-described gas supply systems, one or all of the gas supply systems for supplying the reaction gas may be referred to as a reaction gas supply system or a reactant supply system.

Among the various gases supplied from the above-described gas supply systems, one or all of the gases used in a base film modifying step which will be described later may be referred to as a modifying gas. Among the above-described gas supply systems, one or all of the gas supply systems used in the base film modifying step which will be described later may be referred to as a modifying gas supply system.

An inert gas supply system is mainly configured by the gas supply pipes 232e to 232g, the MFCs 241e to 241g and the valves 243e to 243g. The inert gas supply system may be referred to as a purge gas supply system, a dilution gas supply system or a carrier gas supply system.

Figure 2:
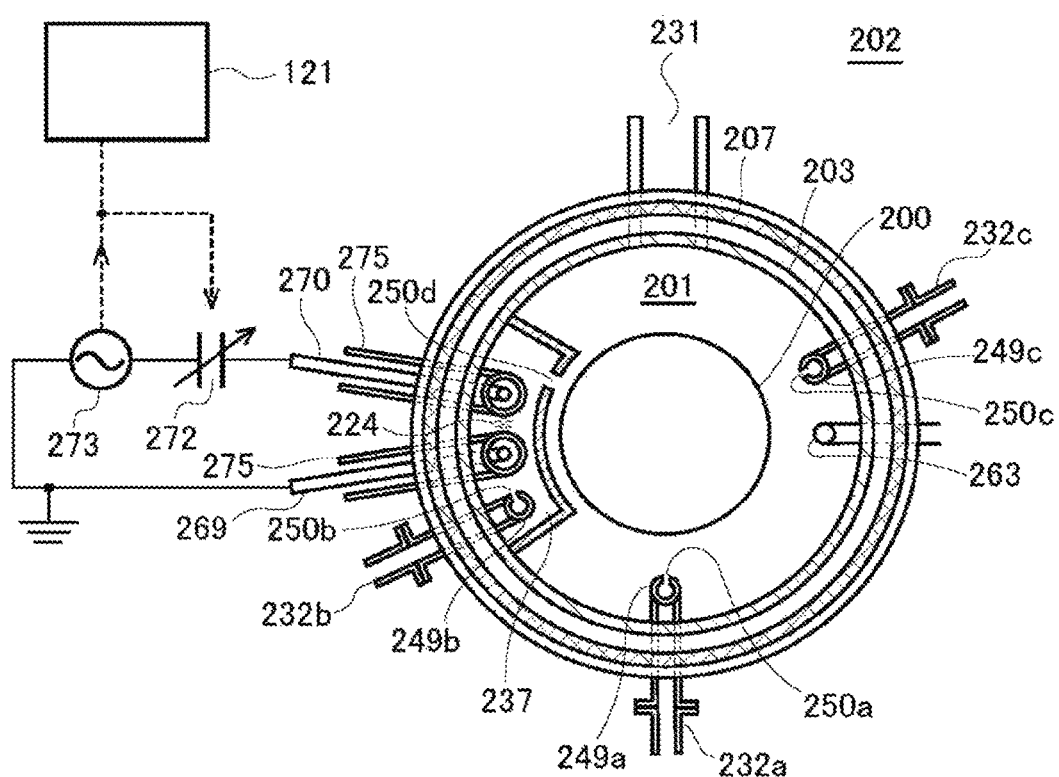
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

In the buffer chamber 237, as illustrated in FIG. 2, two rod-shaped electrodes 269 and 270, which are made of a conductor and have an elongated structure, are disposed along the stack direction of the wafers 200 from the lower portion of the reaction tube 203 to the upper portion thereof. Each of the rod-shaped electrodes 269 and 270 is installed parallel to the nozzle 249c. Each of the rod-shaped electrodes 269 and 270 is covered with and protected by an electrode protection tube 275 over a region from an upper portion to a lower portion thereof. One of the rod-shaped electrodes 269 and 270 is connected to a high-frequency power source 273 via a matcher 272, and the other is connected to ground as a reference electric potential. By applying high-frequency (RF) power from the high-frequency power source 273 between the rod-shaped electrodes 269 and 270 via the matcher 272, plasma is generated in a plasma generation region 224 between the rod-shaped electrodes 269 and 270. A plasma source as a plasma generator (plasma generating part) is mainly configured by the rod-shaped electrodes 269 and 270 and the electrode protection tubes 275. The matcher 272 and the high-frequency power source 273 may also be included in the plasma source. As will be described later, the plasma source functions as a plasma exciting part (an activating mechanism) that plasma-excites a gas, namely, excites (activates) a gas into a plasma state.

Each of the electrode protection tubes 275 has a structure in which each of the rod-shaped electrodes 269 and 270 can be inserted into the buffer chamber 237 while keeping each of the rod-shaped electrodes 269 and 270 isolated from the internal atmosphere of the buffer chamber 237. If an O concentration in each of the electrode protection tubes 275 is substantially equal to an O concentration in the ambient air (atmosphere), each of the rod-shaped electrodes 269 and 270 inserted into the electrode protection tubes 275 may be oxidized by the heat generated from the heater 207. By charging the interior of the electrode protection tubes 275 with an inert gas such as an $N_2$ gas or the like, or by purging the interior of the electrode protection tubes 275 with an inert gas such as an $N_2$ gas or the like through the use of an inert gas purge mechanism, it is possible to reduce the O concentration in the electrode protection tubes 275, thereby preventing oxidation of the rod-shaped electrodes 269 and 270.

The exhaust pipe 231 for exhausting an internal atmosphere of the process chamber 201 is installed in the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure regulating part). The APC valve 244 is configured to start or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system is mainly configured by the exhaust pipe 231, the APC valve 244 and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., SUS or the like, and is formed in a disc shape. An O-ring 220, which is a seal member making contact with the lower end portion of the reaction tube 203, is installed on an upper surface of the seal cap 219. A rotation mechanism 267 configured to rotate the boat 217, which will be described later, is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. That is, the boat elevator 115 is configured as a transfer device (transfer mechanism) which transfers the boat 217, i.e., the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed at the lower portion of the boat 217 in multiple stages. With this configuration, it is hard for heat generated from the heater 207 to be transferred to the seal cap 219. However, the present embodiment is not limited to the above-described configuration. For example, instead of installing the heat insulating plates 218 at the lower portion of the boat 217, a heat insulating tube as a tubular member made of a heat resistant material such as quartz or SiC may be installed at the lower portion the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a to 249c, the temperature sensor 263 is formed in an L-shape. The temperature sensor 263 is installed along the inner wall of the reaction tube 203.

Figure 3:
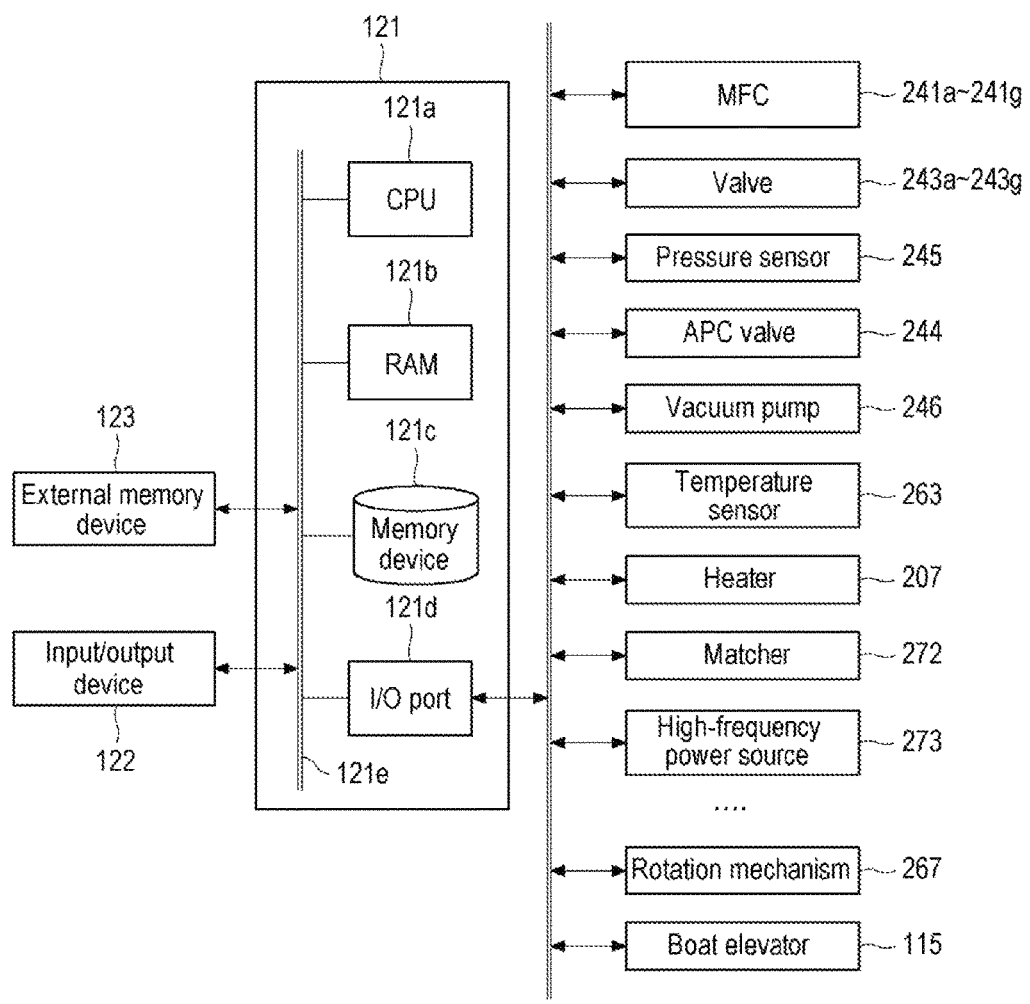
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disc drive (HDD), or the like. A control program for controlling operations of a substrate processing apparatus and a process recipe, in which sequences and conditions of a substrate process to be described later are written, are readably stored in the memory device 121c. The process recipe functions as a program for causing the controller 121 to execute each sequence in the substrate process, which will be described later, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. In addition, the RAM 121b is configured as a memory area (work area) in which a program or data read by the CPU 121a is temporarily stored.

The I/O port 121d is connected to the MFCs 241a to 241g, the valves 243a to 243g, the pressure sensor 245, the APC valve 244, the vacuum pump 246, the heater 207, the temperature sensor 263, the high-frequency power source 273, the matcher 272, the rotation mechanism 267, the boat elevator 115, and so on.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjusting operation of various kinds of gases by the MFCs 241a to 241g, the opening/closing operation of the valves 243a to 243g, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the supply of power to the high-frequency power source 273, the impedance adjusting operation with the matcher 272, the rotation of the boat 217 and adjusting the rotation speed of the boat 217 with the rotation mechanism 267, the operation of moving the boat 217 up and down with the boat elevator 115, and so on, according to contents of the read recipe.

The controller 121 may be configured by a general-purpose computer as well as a dedicated computer. For example, the controller 121 of this embodiment may be configured by installing, on the general-purpose computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). However, the program may be supplied to the computer using communication means such as the Internet or a dedicated line, instead of using the external memory device 123. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123.

(2) Substrate Processing Process

A sequence example of forming a film on a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121.

Figure 4:
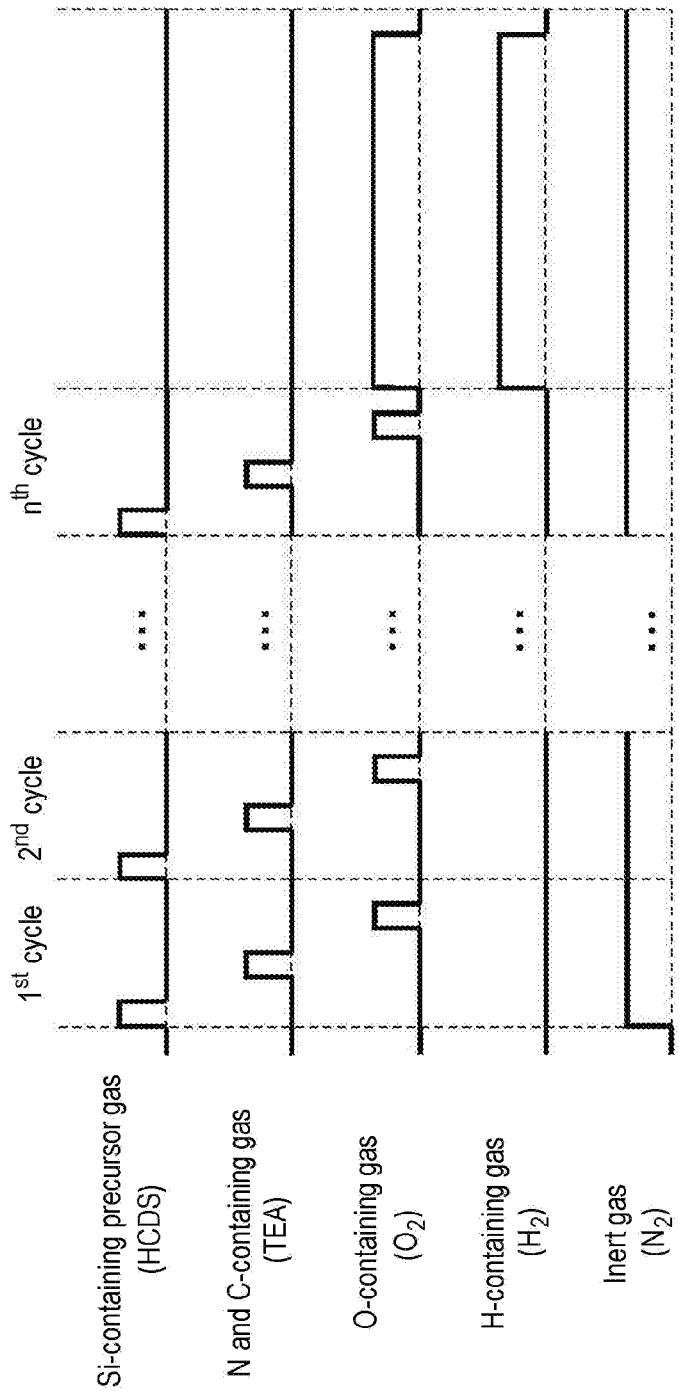
FIG. 4 is a diagram illustrating timing of gas supply in a film forming sequence according to one embodiment of the present disclosure.

The film forming sequence illustrated in FIG. 4 includes a step of forming a silicon oxycarbonitride film (SiOCN film) or a silicon oxycarbide film (SiOC film), as a base film containing Si and C, on the wafer 200 as a substrate by supplying an HCDS gas, a TEA gas, and an $O_2$ gas, as film forming gases, to the wafer 200; and a step of modifying the base film into a Si-containing and C-free oxide film, i.e., a silicon oxide film (SiO film), by oxidizing the base film by supplying an $O_2$ gas and an $H_2$ gas, as oxidizing gases, to the wafer 200.

The base film forming step includes performing, a predetermined number of times (once or more), a cycle that non-simultaneously, i.e., non-synchronously, performs: a step of supplying the HCDS gas to the wafer 200 in the process chamber 201; a step of supplying the TEA gas to the wafer 200 in the process chamber 201; and a step of supplying the $O_2$ gas to the wafer 200 in the process chamber 201.

The base film modifying step includes supplying the $O_2$ gas and the $H_2$ gas into the process chamber 201 in which the wafer 200 on which the base film is formed is accommodated, the process chamber 201 being heated under a pressure lower than the atmospheric pressure; and supplying oxidizing species, which include atomic oxygen (O) generated by causing the $O_2$ gas and the $H_2$ gas to react with each other, to the wafer 200, i.e., the base film containing Si and C.

In the present disclosure, for the sake of convenience, the above-described film forming sequence may sometimes be denoted as follows.

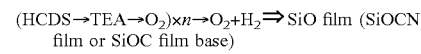

(HCDS→TEA→$O_2$)×$n$→$O_2$+$H_2$⇒SiO film (SiOCN film or SiOC film base)

When the term "wafer" is used in the present disclosure, the wafer may refer to "a wafer itself" or "a wafer and a laminated body (aggregate) of predetermined layers or films formed on a surface of the wafer". That is to say, a wafer including predetermined layers or films formed on its surface may be referred to as a wafer. In addition, when the phrase "a surface of a wafer" is used in the present disclosure, "a surface of a wafer" may refer to "a surface (exposed surface) of a wafer itself" or "a surface of a predetermined layer or film formed on a wafer, namely an uppermost surface of the wafer, which is a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used in the present disclosure, the "substrate" may be synonymous with the term "wafer". In this case, in the above description, the "wafer" may be substituted with the "substrate".

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 through the O-ring 220.

(Pressure Adjustment and Temperature Adjustment)

The interior of the process chamber 201, namely the space in which the wafers 200 exist, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Base Film Forming Step)

Next, the following three steps 1 to 3 are sequentially performed.

[Step 1]

(HCDS Gas Supply)

At this step, an HCDS gas is supplied to the wafer 200 in the process chamber 201.

Specifically, the valve 243a is opened to allow an HCDS gas to flow through the gas supply pipe 232a. A flow rate of the HCDS gas is adjusted by the MFC 241a, and then the HCDS gas is supplied into the process chamber 201 via the nozzle 249a and is exhausted through the exhaust pipe 231. At this time, the HCDS gas is supplied to the wafer 200. At the same time, the valve 243e is opened to allow an $N_2$ gas to flow through the gas supply pipe 232e. A flow rate of the $N_2$ gas is adjusted by the MFC 241e, and the $N_2$ gas is supplied into the process chamber 201 together with the HCDS gas and is exhausted through the exhaust pipe 231.

In addition, in order to prevent the HCDS gas from infiltrating into the buffer chamber 237 and the nozzles 249b and 249c, the valves 243f and 243g are opened to allow the $N_2$ gas to flow through the gas supply pipes 232f and 232g. The $N_2$ gas is supplied into the process chamber 201 through the gas supply pipes 232b and 232c, the nozzles 249b and the 249c and the buffer chamber 237 and is exhausted through the exhaust pipe 231.

A supply flow rate of the HCDS gas, which is controlled by the MFC 241a, is set to fall within a range of, e.g., 1 to 2,000 sccm, specifically, 10 to 1,000 sccm. Supply flow rates of the $N_2$ gas, which are controlled by the MFCs 241e to 241g, are set to fall within a range of, e.g., 100 to 10,000 sccm, respectively. An internal pressure of the process chamber 201 is set to fall within a range of, e.g., 1 to 2,666 Pa, specifically 67 to 1,333 Pa. A time period for supplying the HCDS gas to the wafer 200, namely a gas supply time (irradiation time), is set to fall within a range of, e.g., 1 to 120 seconds, specifically 1 to 60 seconds. The temperature of the heater 207 is set such that the temperature of the wafer 200 falls within a range of, e.g., 250 to 700 degrees C., specifically 300 to 650 degrees C., more specifically 350 to 600 degrees C.

If the temperature of the wafer 200 becomes lower than 250 degrees C., the HCDS gas is hardly chemisorbed onto the wafer 200. Thus, there may be a case where a practical deposition rate is not obtained. This problem may be solved by setting the temperature of the wafer 200 at 250 degrees C. or higher. By setting the temperature of the wafer 200 at 300 degrees C. or higher, ultimately at 350 degrees C. or higher, it is possible to allow the HCDS gas to be sufficiently adsorbed onto the wafer 200. Thus, a more sufficient deposition rate is obtained.

If the temperature of the wafer 200 exceeds 700 degrees C., a CVD reaction becomes too strong (i.e., an excessive gas phase reaction is generated). Thus, the film thickness uniformity easily deteriorates and is hardly controlled. By setting the temperature of the wafer 200 at 700 degrees C. or lower, it is possible to generate a suitable gas phase reaction. This makes it possible to suppress deterioration of the film thickness uniformity and to control the film thickness uniformity. Particularly, if the temperature of the wafer 200 is set at 650 degrees C. or lower, ultimately at 600 degrees C. or lower, a surface reaction becomes more dominant than a gas phase reaction. This makes it easy to secure the film thickness uniformity and to control the film thickness uniformity.

Accordingly, the temperature of the wafer 200 may be set to fall within a range of 250 to 700 degrees C., specifically 300 to 650 degrees C., more specifically 350 to 600 degrees C.

By supplying the HCDS gas to the wafer 200 under the aforementioned conditions, a first layer, for example, a Si-containing layer containing Cl and having a thickness of from less than one atomic layer to several atomic layers, is formed on the uppermost surface of the wafer 200. The Si-containing layer containing Cl may include a Cl-containing Si layer, an adsorption layer of HCDS, or both.

The Cl-containing Si layer is a generic name that encompasses a continuous or discontinuous layer containing Cl, which is composed of Si, and a Si thin film containing Cl, which is formed of the layers overlapping with one another. The continuous layer containing Cl, which is composed of Si, is sometimes referred to as a Si thin film containing Cl. The Si which constitutes the Si layer containing Cl includes not only Si whose bond to Cl is not completely broken, but also Si whose bond to Cl is completely broken.

The adsorption layer of HCDS includes not only a continuous adsorption layer composed of HCDS molecules but also a discontinuous adsorption layer. That is, the adsorption layer of HCDS includes an adsorption layer having a thickness of one molecular layer or less than one molecular layer, which is composed of HCDS molecules. The HCDS molecules that constitute the adsorption layer of HCDS include a molecule in which Si—Cl bonds are partially broken. That is, the adsorption layer of HCDS may include a physical adsorption layer of HCDS, a chemisorption layer of HCDS, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Si-containing layer containing Cl may include both a Si layer containing Cl and an adsorption layer of HCDS. As described above, expressions such as "one atomic layer", "several atomic layers" and the like will be used with respect to the Si-containing layer containing Cl.

Under a condition in which the HCDS gas is autolyzed (or pyrolyzed), i.e., a condition in which a pyrolysis reaction of the HCDS gas is generated, Si is deposited on the wafer 200 to form a Si layer containing Cl. Under a condition in which the HCDS gas is not autolyzed (or pyrolyzed), i.e., a condition in which a pyrolysis reaction of the HCDS gas is not generated, HCDS is adsorbed onto the wafer 200 to form an adsorption layer of HCDS. From the viewpoint of increasing the deposition rate, it may be more advantageous to form the Si layer containing Cl on the wafer 200 than to form the adsorption layer of HCDS on the wafer 200.

If the thickness of the first layer exceeds several atomic layers, a modifying reaction at steps 2 and 3, which will be described later, does not affect the entire first layer. In addition, a minimum value of the thickness of the first layer is less than one atomic layer. Accordingly, the thickness of the first layer may be set to fall within a range of less than one atomic layer to several atomic layers. By setting the thickness of the first layer to become one atomic layer or less, namely one atomic layer or less than one atomic layer, it is possible to relatively increase the modifying reaction at the steps 2 and 3 which will be described later and to shorten the time required for the modifying reaction at the steps 2 and 3. It is also possible to shorten the time required for formation of the first layer at the step 1. Consequently, it is possible to shorten the processing time per one cycle. This makes it possible to shorten the total processing time. That is, it is possible to increase the deposition rate. Furthermore, by setting the thickness of the first layer to become one atomic layer or less, it is possible to enhance the controllability of the film thickness uniformity.

(Residual Gas Removal)

After the first layer is formed, the valve 243a is closed to stop the supply of the HCDS gas. At this time, the interior of the process chamber 201 is vacuum-exhausted by the vacuum pump 246 while opening the APC valve 244. Thus, the HCDS gas remaining in the process chamber 201, which has not reacted or which has contributed to the formation of the first layer, is discharged (i.e., removed) from the interior of the process chamber 201. At this time, the supply of the $N_2$ gas into the process chamber 201 may be maintained while opening the valves 243e to 243g. The $N_2$ gas acts as a purge gas. This makes it possible to enhance the effect of discharging the gas remaining in the process chamber 201 from the interior of the process chamber 201.

At this time, the gas remaining in the process chamber 201 may not completely be removed and the interior of the process chamber 201 may not completely be purged. When the gas remaining in the process chamber 201 is very small in amount, there is no harmful effect on the subsequent step 2. In addition, a flow rate of the $N_2$ gas supplied into the process chamber 201 need not be high. For example, when approximately the same amount of the $N_2$ gas as the volume of the reaction tube 203 (the process chamber 201) is supplied, a purging process can be performed without a harmful effect on the step 2. In this way, since the interior of the process chamber 201 is not completely purged, the purge time can be reduced and a throughput can be improved. In addition, the consumption of the $N_2$ gas can be restricted to a required minimal amount.

As a precursor gas used as the film forming gas, in addition to the HCDS gas, it may be possible to use, e.g., an inorganic precursor gas such as a dichlorosilane ($SiH_2Cl_2$, abbreviation: DCS) gas, a monochlorosilane ($SiH_3Cl$, abbreviation: MCS) gas, a tetrachlorosilane, i.e., silicon tetrachloride ($SiCl_4$, abbreviation: STC) gas, a trichlorosilane ($SiHCl_3$, abbreviation: TCS) gas, a trisilane ($Si_3H_8$, abbreviation: TS) gas, a disilane ($Si_2H_6$, abbreviation: DS) gas, a monosilane ($SiH_4$, abbreviation: MS) gas, or the like, or an organic precursor gas such as a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdiethylaminosilane ($Si[N(C_2H_5)_2]_2H_2$, abbreviation: BDEAS) gas, a bis-tert-butylaminosilane ($SiH_2[NH(C_4H_9)]_2$, abbreviation: BTBAS) gas, or the like.

As the inert gas, in addition to the $N_2$ gas, it may be possible to use, e.g., a rare gas such as an Ar gas, a He gas, a Ne gas, a Xe gas or the like.

[Step 2]

(TEA Gas Supply)

After the step 1 is completed, a TEA gas activated by heat is supplied to the wafer 200 in the process chamber 201.

At this step, the opening/closing control of the valves 243b and 243e to 243g is performed in the same procedure as the opening/closing control of the valves 243a and 243e to 243e performed at the step 1. The TEA gas is supplied into the process chamber 201 via the gas supply pipe 232b, the nozzle 249b and the buffer chamber 237 and is exhausted through the exhaust pipe 231. At this time, the TEA gas is supplied to the wafer 200.

The supply flow rate of the TEA gas controlled by the MFC 241b is set to fall within a range of, e.g., 100 to 10,000 sccm. The internal pressure of the process chamber 201 is set to fall within a range of, e.g., 1 to 5,000 Pa, specifically 1 to 4,000 Pa. A partial pressure of the TEA gas in the process chamber 201 is set to fall within a range of, e.g., 0.01 to 4,950 Pa. By setting the internal pressure of the process chamber 201 to fall within such a relatively high pressure zone, it is possible to thermally activate the TEA gas in a non-plasma manner. If the TEA gas is supplied by thermally activating the same, it is possible to generate a relatively soft reaction and perform a relatively soft modifying step which will be described later. A time period for supplying the TEA gas to the wafer 200, namely a gas supply time (irradiation time), is set to fall within a range of, e.g., 1 to 120 seconds, specifically 1 to 60 seconds. Other processing conditions may be similar to, e.g., the processing conditions of the step 1.

As the TEA gas is supplied to the wafer 200 under the above-described conditions, the first layer formed on the wafer 200 can react with the TEA gas to modify the first layer. At this time, by adding a C component and an N component contained in the TEA gas to the first layer, a second layer containing Si, C and N, i.e., a SiCN layer (an Si layer containing C and N), can be formed on the wafer 200.

When the second layer is formed, Cl contained in the first layer constitutes a substance in a gaseous state containing at least Cl in a modification reaction procedure of the first layer by the TEA gas, and is exhausted out of the process chamber 201. That is, impurities such as Cl contained in the first layer are extracted or desorbed from the first layer, thereby being separated from the first layer. Accordingly, the second layer has fewer impurities such as Cl than the first layer.

(Residual Gas Removal)

After the second layer is formed, the valve 243b is closed to stop the supply of the TEA gas. According to the processing procedure similar to that of the step 1, the TEA gas remaining in the process chamber 201, which has not reacted or which has contributed to the formation of the second layer, and the reaction byproducts remaining in the process chamber 201, are discharged (i.e., removed) from the interior of the process chamber 201. At this time, the point that the gas remaining in the process chamber 201 may not completely be removed is the same as in the step 1.

As an N and C-containing gas used as the film forming gas, in addition to the TEA gas, it may be possible to use, e.g., an ethylamine-based gas such as a diethylamine (($C_2H_5$)$_2$NH, abbreviation: DEA) gas, a monoethylamine ($C_2H_5NH_2$, abbreviation: MEA) gas or the like, a methylamine-based gas such as a trimethylamine (($CH_3$)$_3$N, abbreviation: TMA) gas, a dimethylamine (($CH_3$)$_2$NH, abbreviation: DMA) gas, a monomethylamine ($CH_3NH_2$, abbreviation: MMA) gas, or the like. In addition, as the N and C-containing gas, in addition to the amine-based gas, it may be possible to use, e.g., an organic hydrazine-based gas. As the organic hydrazine-based gas, it may be possible to use, e.g., a methylhydrazine-based gas such as a monomethylhydrazine (($CH_3$)HN$_2$H$_2$, abbreviation: MMH) gas, a dimethylhydrazine (($CH_3$)$_2$N$_2$H$_2$, abbreviation: DMH) gas, a trimethylhydrazine (($CH_3$)$_2$N$_2$($CH_3$)H, abbreviation: TMH) gas, or an ethylhydrazine-based gas such as an ethylhydrazine (($C_2H_5$)HN$_2$H$_2$, abbreviation: EH) gas, or the like.

As the amine-based gas or the organic hydrazine-based gas, there may be used a gas having a plurality of ligands containing C in one molecule, that is, a gas having a plurality of hydrocarbon groups such as alkyl groups in one molecule. Specifically, as the amine-based gas or the organic hydrazine-based gas, there may be used a gas having three or two organic ligands (hydrocarbon groups such as alkyl groups) containing C in one molecule. In this case, a large amount of C, N or the like can be contained in the base film, and, as a result, the effect at the time of performing the modifying step to be described later can be enhanced.

As the inert gas, in addition to the $N_2$ gas, it may be possible to use, e.g., a rare gas such as an Ar gas, a He gas, a Ne gas, a Xe gas or the like.

[Step 3]
($O_2$ Gas Supply)

After the step 2 is completed, an $O_2$ gas activated by heat is supplied to the wafer 200 in the process chamber 201.

At this step, the opening/closing control of the valves 243b and 243e to 243g is performed using the same procedure as the opening/closing control of the valves 243a and 243e to 243g performed at the step 1. The $O_2$ gas is supplied into the process chamber 201 via the gas supply pipe 232b, the nozzle 249b and the buffer chamber 237 and is exhausted through the exhaust pipe 231. At this time, the $O_2$ gas is supplied to the wafer 200.

The supply flow rate of the $O_2$ gas controlled by the MFC 241b is set to fall within a range of, e.g., 100 to 10,000 sccm. The internal pressure of the process chamber 201 is set to fall within a range of, e.g., 1 to 4,000 Pa, specifically 1 to 3,000 Pa. A partial pressure of the $O_2$ gas in the process chamber 201 is set to fall within a range of, e.g., 0.01 to 3,960 Pa. By setting the internal pressure of the process chamber 201 to fall within such a relatively high pressure zone, it is possible to thermally activate the $O_2$ gas in a non-plasma manner. If the $O_2$ gas is supplied by thermally activating the same, it is possible to generate a relatively soft reaction and softly perform oxidation which will be described later. A time period for supplying the $O_2$ gas to the wafer 200, namely a gas supply time (irradiation time), is set to fall within a range of, e.g., 1 to 120 seconds, specifically 1 to 60 seconds. Other processing conditions may be similar to, e.g., the processing conditions of the step 1.

As the $O_2$ gas is supplied to the wafer 200 under the above-described conditions, the second layer formed on the wafer 200 can react with the $O_2$ gas to modify (oxidize) the second layer. At this time, by adding an O component contained in the $O_2$ gas to the second layer, a third layer containing Si, O, C and N, i.e., a SiOCN layer (an Si layer containing O, C and N) as a base layer containing Si and C, can be formed on the wafer 200. At this time, most of N contained in the second layer can be desorbed to an impurity level or N contained in the second layer can be substantially extinguished. In this case, the base layer becomes an N-free layer containing Si, O and C, that is, a SiOC layer (a Si film including O and C). However, it is more preferable to retain N in the base layer to some extent than to eliminate all N in the base layer, because it is possible to enhance the effect of performing the modifying step to be described later. That is, it is more preferable to form the SiOCN layer than to form the SiOC layer as the base layer, because it is easy to form a high quality $SiO_2$ film in the modifying step to be described later.

When the base layer is formed, desorption of C and N from the second layer can be easily suppressed by appropriately lowering an oxidizing power, for example, by lowering the ultimate pressure in the process chamber 201. Since a Si—O bond has larger bonding energy than a Si—C bond and a Si—N bond, the Si—C bond and the Si—N bond tend to be broken when the Si—O bond is formed. On the other hand, by appropriately lowering the oxidizing power, it is possible to suppress the breakage of the Si—C bond and the Si—N bond when the Si—O bond is formed in the second layer and it is easy to prevent C and N disconnected from Si from being desorbed from the second layer. By preventing C and N from being desorbed from the second layer, it is possible to leave an appropriate amount of C and N in the base layer, that is, to make the base layer a layer containing C and N.

When the base layer is formed, Cl contained in the second layer makes up a gaseous material containing at least Cl in the course of the modifying reaction caused by the $O_2$ gas. The gaseous material is discharged from the interior of the process chamber 201. That is, the impurities such as Cl and the like contained in the second layer are extracted or desorbed from the second layer and are separated from the second layer. Thus, the base layer becomes a layer containing fewer impurities such as Cl and the like than the second layer.

(Residual Gas Removal)

After the based layer is formed, the valve 243b is closed to stop the supply of the $O_2$ gas. According to the processing procedure similar to that of the step 1, the $O_2$ gas remaining in the process chamber 201, which has not reacted or which has contributed to the formation of the base layer, and the reaction byproducts remaining in the process chamber 201, are discharged (i.e., removed) from the interior of the process chamber 201. At this time, the point that the gas remaining in the process chamber 201 may not completely be removed is the same as in the step 1.

As an oxidizing gas used as the film forming gas, in addition to the $O_2$ gas, it may be possible to use water vapor ($H_2O$ gas), nitric monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, a mixture of hydrogen ($H_2$) gas and $O_2$ gas, a mixture of $H_2$ gas and $O_3$ gas, or the like.

As the inert gas, in addition to the $N_2$ gas, it may be possible to use, e.g., a rare gas such as an Ar gas, a He gas, a Ne gas, a Xe gas or the like.

(Performing a Predetermined Number of Times)

A cycle which non-simultaneously, i.e., non-synchronously, performs the above-described steps 1 to 3 is performed once or more (a predetermined number of times) to thereby form a SiOCN film (a Si film containing O, C and N) or a SiOC film (a Si film containing O and C) having a predetermined composition and a predetermined thickness, as a base film containing Si and C, on the wafer 200. The above cycle may be repeated multiple times. That is, the thickness of the base layer formed when performing the aforementioned cycle once may be set to become smaller than a desired film thickness. Thus, the above cycle may be repeated multiple times until the film thickness of a base film formed by laminating the base layers becomes equal to the desired film thickness.

(Base Film Modifying Step)

After the base film is formed, an $O_2$ gas and an $H_2$ gas are supplied into the process chamber 201 heated under a pressure lower than atmospheric pressure and oxidizing species, which include atomic oxygen (O) generated by causing the $O_2$ gas and the $H_2$ gas to react with each other, are supplied to the wafer 200.

At this step, the opening/closing control of the valves 243b and 243e to 243g is performed in the same procedure as the opening/closing control of the valves 243b and 243e to 243g performed at the above-described step 3. The $O_2$ gas is supplied into the process chamber 201 via the gas supply pipe 232b, the nozzle 249b and the buffer chamber 237. At the same time, the valve 243c is opened to allow an $H_2$ gas to flow through the gas supply pipe 232c. A flow rate of the $H_2$ gas is adjusted by the MFC 241c and the $H_2$ gas is supplied into the process chamber 201 via the nozzle 249c. The $O_2$ gas and the $H_2$ gas are mixed in the process chamber 201 and are exhausted through the exhaust pipe 231.

The supply flow rate of the $O_2$ gas controlled by the MFC 241b and the supply flow rate of the $H_2$ gas controlled by the MFC 241c are set to fall within a range of, e.g., 100 to 10,000 sccm. The internal pressure of the process chamber 201 is set to fall within a range of, e.g., 1 to 1,330 Pa. A time period for supplying the $O_2$ gas and the $H_2$ gas to the wafer 200, namely a gas supply time (irradiation time), is set to fall within a range of, e.g., 60 to 1,200 seconds, specifically 120 to 600 seconds. The temperature of the heater 207 is set to a temperature zone at which the effect of improving the oxidizing power to be described later becomes remarkable, for example, to fall within a range of, e.g., 400 to 1,200 degrees C., specifically 450 to 1,000 degrees C. With this temperature range, it was confirmed that the effect of improvement of oxidizing power (which will be described later) by the addition of the $H_2$ gas to the $O_2$ gas under a reduced pressure atmosphere becomes remarkable. When the temperature of the wafer 200 is too low, it was also confirmed that the effect of improvement of oxidizing power could not be obtained. However, in consideration of a throughput, it is preferable to maintain the temperature in the process chamber 201 at the same temperature zone as in the base film forming step and the base film modifying step. In this case, from the base film forming step to the base film modifying step, the temperature of the heater 207 is set so that the interior of the process chamber 201 has a constant temperature within a range of, e.g., 400 to 700 degrees C., specifically 450 to 650 degrees C.

By supplying the $O_2$ gas and the $H_2$ gas into the process chamber 201 under the aforementioned conditions, the $O_2$ gas and the $H_2$ gas are thermally activated (excited) and react with each other in a non-plasma manner under a heated reduced atmosphere, to thereby generate water ($H_2O$)-free oxidizing species (referred also to as reactant species) including oxygen such as atomic oxygen (O). Then, these oxidizing species are mainly used to oxidize the base film formed on the wafer 200. Since energy of this oxidizing species is greater than the bonding energy of Si—C, C—C, Si—N Si—Cl and Si—H bonds included in the base film, the Si—C, C—C, Si—N Si—Cl and Si—H bonds included in the base film are separated by applying this oxidizing species energy to the base film. C, N, Cl and H from which the bonds are separated are removed from the base film and are discharged as $CO_2$, CO, $N_2O$, $NO_2$, NO, $N_2$, $Cl_2$, HCl, $H_2$ and the like. In addition, the atomic bonding of Si remaining after the bond with C, N, Cl and H is cut off is combined with O contained in the oxidizing species to thereby form a Si—O bond. Thus, the base film can be changed (modified) into a SiO film containing a small amount of impurities such as C, N, Cl, H and the like. In addition, since a weak bond contained in the base film is replaced with a strong Si—O bond, the base film shrinks greatly. As a result, the base film is changed into a robust and dense SiO film having strong bonds between atoms constituting the film.

Incidentally, with this oxidation, the oxidizing power can be significantly increased over a case where the $O_2$ gas is supplied alone and a case where the $H_2O$ gas is supplied. That is, by adding the $H_2$ gas to the $O_2$ gas under a reduced-pressure atmosphere, the oxidizing power can be significantly improved over the case where the $O_2$ gas is supplied alone and the case where the $H_2O$ gas is supplied. In addition, by setting the internal temperature of the process chamber 201 to 400 degrees C. or higher, it is possible to obtain an oxidizing power exceeding an oxidizing power obtained by $O_3$ oxidation performed at a temperature of 400 degrees C. or higher. Further, by setting the internal temperature of the process chamber 201 to 450 degrees C. or higher, it is possible to obtain an oxidizing power exceeding an oxidizing power obtained by $O_2$ plasma oxidation performed at a temperature of 450 degrees C. or higher.

As an O-containing gas, in addition to the $O_2$ gas, it may be possible to use, e.g., a $N_2O$ gas, a NO gas, a $NO_2$ gas, an $O_3$ gas, a mixture of $H_2$ gas and $O_2$ gas, a mixture of $H_2$ gas and $O_3$ gas, a $H_2O$ gas, a CO gas, a $CO_2$ gas or the like. As a H-containing gas, it may be possible to use a H2 gas, a deuterium ($D_2$) gas or the like.

(Purging and Atmospheric Pressure Returning)

After the base film modifying step is completed, the valves 243b and 243c are closed to stop the supply of the $O_2$ gas and the $H_2$ gas, respectively. At this time, the interior of the process chamber 201 is vacuum-exhausted by the vacuum pump 246 while opening the APC valve 244. Thus, the $O_2$ gas and the $H_2$ gas remaining in the process chamber 201, which has not reacted or which has contributed to the modification of the base film, is discharged from the interior of the process chamber 201. At this time, an $N_2$ gas is supplied into the process chamber 201 from each of the gas supply pipes 232e to 232g while opening the valves 243e to 243g, and is exhausted through the exhaust pipe 231. The $N_2$ gas serves as a purge gas. Thus, the interior of the process chamber 201 is purged, and the residual gas and the reaction byproducts remaining in the process chamber 201 are removed from the interior of the process chamber 201 (purging). Thereafter, the internal atmosphere of the process chamber 201 is substituted with an inert gas (inert gas substitution), and the internal pressure of the process chamber 201 is returned to an atmospheric pressure (return to atmospheric pressure).

(Boat Unloading and Wafer Discharging)

The seal cap 219 is moved down by the boat elevator 115 to open the lower end of the reaction tube 203. The processed wafers 200 supported by the boat 217 are unloaded from the lower end of the reaction tube 203 outside of the reaction tube 203 (boat unloading). The processed wafers 200 are discharged from the boat 217 (wafer discharging).

(3) Effects According to the Present Embodiment

According to the present embodiment, one or more effects set forth below may be achieved.

(a) By forming a film containing Si and C as a base film and oxidizing this base film containing C to be modified into a C-free SiO film, the SiO film can be finally formed to have a low impurity concentration and a high etching resistance. That is, according to the film formation method of this embodiment, it is possible to form a robust SiO film having a low impurity concentration as compared to a case of forming a C-free and Si-containing film (for example, a Si film) as a base film and oxidizing the C-free base film to be modified into a SiO film.

This may be because the base film of the present embodiment, i.e., the Si-containing film containing C, N, Cl, H and the like, has more Si—C, C—C, Si—N, Si—Cl, Si—H bonds having relatively low bonding energy, more C, N, Cl and H having a dangling bond, more defects and the like. As described above, since the base film (SiOCN film or SiOC film) of the present embodiment has relatively weak bonds between atoms constituting the film and a relatively low density, the base film is strongly affected by the modifying process as compared with a C-free base film (for example, a Si film). Therefore, the base film of the present embodiment is modified more than the C-free base film, so that impurities contained in the film are efficiently removed. In addition, as compared with the C-free base film, the modified base film of the present embodiment shrinks greatly and has a strong bonding between atoms constituting the film and a high density. As a result, it is considered that the SiO film formed according to the film forming method of the present embodiment is stronger and has a lower impurity concentration than a SiO film formed by modifying a C-free base film.

(b) In the base film modifying step, since oxidizing species such as atomic oxygen (O) generated by the reaction of an $O_2$ gas and a $H_2$ gas are used to perform the oxidizing process, it is possible to significantly increase the oxidizing power over a case where the $O_2$ gas is supplied alone and a case where a $H_2O$ gas is supplied. This makes it possible to further enhance the effect of the above-described modifying process and makes it easier to form a robust SiO film having a low impurity concentration.

(c) In the base film forming step, by non-simultaneously performing the steps 1 to 3, it is possible to make a proper reaction of plural kinds of film forming gases under the conditions where a vapor phase reaction or a surface reaction properly occurs. As a result, it is possible to improve step coverage and film thickness controllability of the base film, that is, the SiO film finally formed. In addition, it is possible to avoid an excessive vapor phase reaction in the process chamber 201 and suppress generation of particles.

(d) The aforementioned effects can be equally achieved in a case where film forming gases other than the HCDS gas, the TEA gas and the $O_2$ gas are used and in a case where oxidizing gases other than the $O_2$ gas and the $H_2$ gas are used.

(4) Modifications

The film forming sequence of the present embodiment is not limited to that shown in FIG. 4 but may be modified in many different ways as follows.

(Modifications 1 to 5)

For example, a SiO film may be formed on the wafer 200 according to the following film forming sequences (in order of Modifications 1 to 5). Even with these modifications, the same effects as the film forming sequence shown in FIG. 4 can be obtained.

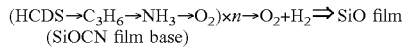

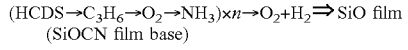

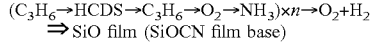

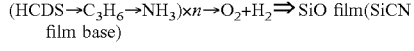

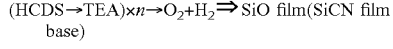

(Modifications 6 to 10)

For example, as a precursor gas, in addition to the above-described various silane precursor gases, it may be possible to use, e.g., an alkylhalosilane precursor gas such as a 1,1,2,2-tetrachloro-1,2-dimethyldisilane (($CH_3$)$_2Si_2Cl_4$, abbreviation: TCDMDS) gas, an alkylenehalosilane precursor gas such as a bis(trichlorosilyl)methane (($SiCl_3$)$_2CH_2$, abbreviation: BTCSM) gas, an alkylenesilane precursor gas such as a 1,4-disilabutane ($Si_2C_2H_{10}$, abbreviation: DSB) gas, or the like. That is, as the precursor gas, a silane precursor gas having a Si—C bond in its chemical structural formula (in one molecule) and also serving as a C source may be used. Several film forming sequences in a case where the TCDMDS gas, the DSB gas and the BTCSM gas are used as precursor gases are shown below (in order of Modifications 6 to 10). Even with these modifications, the same effects as the film forming sequence shown in FIG. 4 can be obtained.

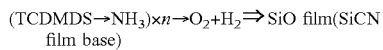

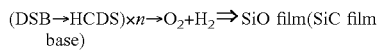

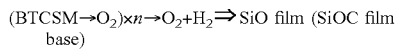

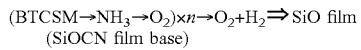

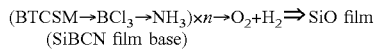

(Modifications 11 to 21)

Figure 5:
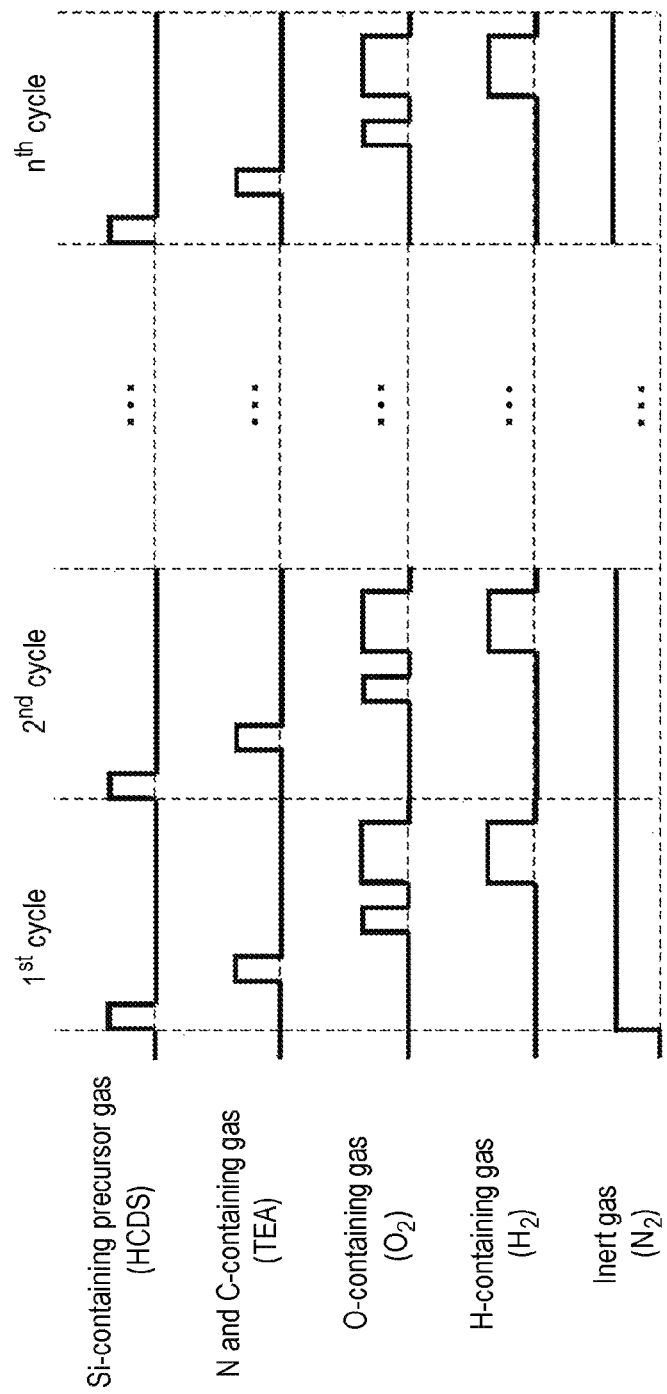
FIG. 5 is a diagram illustrating timing of gas supply in Modification 11 of the film forming sequence according to one embodiment of the present disclosure.

In the film forming sequence shown in FIG. 4, an example in which the base film is formed by performing the base layer forming step (the steps 1 to 3) for a plurality of cycles has been described. However, the present embodiment is not limited thereto. For example, the base layer forming step may be performed for one cycle to form the base film. Some film forming sequences of these modifications are shown below (in order of Modifications 11 to 21). In these modifications, a base layer modifying step is performed every time the base layer forming step is performed for one cycle. That is, in these modifications, a step of forming a base film by performing the base layer forming step for one cycle and a step of modifying the base film are alternately repeated. FIG. 5 is a diagram showing a film forming sequence of Modification 11. Even with these modifications, the same effects as the film forming sequence shown in FIG. 4 can be obtained. Further, according to these modifications, since the modifying step is performed in a state in which the thickness of the base film is small, it is easy to spread the aforementioned effects obtained by performing the modifying step over the entire region of the base film.

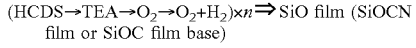
(HCDS→TEA→O$_2$→O$_2$+H$_2$)×n ⇒ SiO film (SiOCN film or SiOC film base)

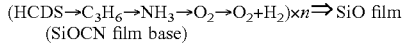
(HCDS→C$_3$H$_6$→NH$_3$→O$_2$→O$_2$+H$_2$)×n ⇒ SiO film (SiOCN film base)

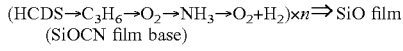
(HCDS→C$_3$H$_6$→O$_2$→NH$_3$→O$_2$+H$_2$)×n ⇒ SiO film (SiOCN film base)

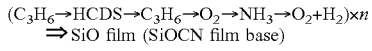
(C$_3$H$_6$→HCDS→C$_3$H$_6$→O$_2$→NH$_3$→O$_2$+H$_2$)×n ⇒ SiO film (SiOCN film base)

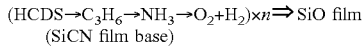
(HCDS→C$_3$H$_6$→NH$_3$→O$_2$+H$_2$)×n ⇒ SiO film (SiCN film base)

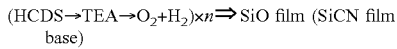
(HCDS→TEA→O$_2$+H$_2$)×n ⇒ SiO film (SiCN film base)

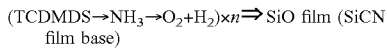
(TCDMDS→NH$_3$→O$_2$+H$_2$)×n ⇒ SiO film (SiCN film base)

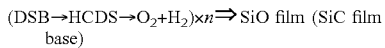
(DSB→HCDS→O$_2$+H$_2$)×n ⇒ SiO film (SiC film base)

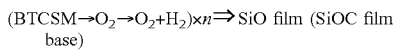
(BTCSM→O$_2$→O$_2$+H$_2$)×n ⇒ SiO film (SiOC film base)

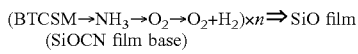
(BTCSM→NH$_3$→O$_2$→O$_2$+H$_2$)×n ⇒ SiO film (SiOCN film base)

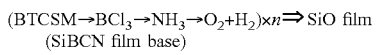
(BTCSM→BCl$_3$→NH$_3$→O$_2$+H$_2$)×n ⇒ SiO film (SiBCN film base)

(Modifications 22 to 33)

Figure 6:
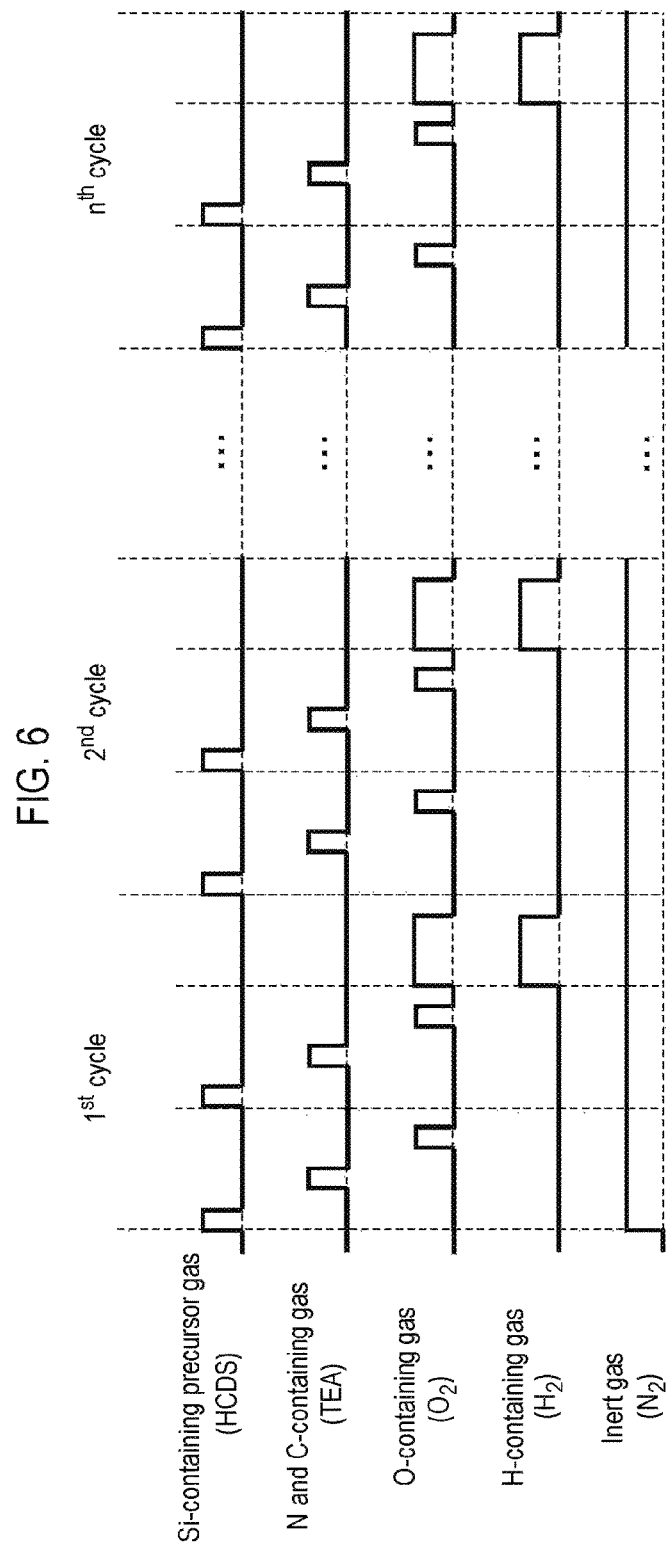
FIG. 6 is a diagram illustrating timing of gas supply in Modification 22 of the film forming sequence according to one embodiment of the present disclosure.

In the film forming sequence shown in FIG. 4, an example in which the base film is formed by performing the base layer forming step (the steps 1 to 3) for a plurality of cycles has been described. However, the present embodiment is not limited thereto. For example, the base layer forming step may be performed for several cycles (m times) to form the base film. Some film forming sequences of these modifications are shown below (in order of Modifications 22 to 33). In these modifications, a base layer modifying step is performed every time the base layer forming step is performed for several cycles. That is, in these modifications, a step of forming a base film by performing the base layer forming step for several cycles and a step of modifying the base film are alternately repeated. FIG. 6 is a diagram showing a film forming sequence of Modification 22. Even with these modifications, the same effects as the film forming sequence shown in FIG. 4 can be obtained. Further, according to these modifications, since the modifying step is performed in a state in which the thickness of the base film is small, it is easy to spread the aforementioned effects obtained by performing the modifying step over the entire region of the base film.

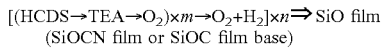
[(HCDS→TEA→O$_2$)×m→O$_2$+H$_2$]×n ⇒ SiO film (SiOCN film or SiOC film base)

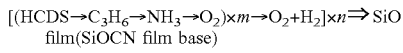
[(HCDS→C$_3$H$_6$→NH$_3$→O$_2$)×m→O$_2$+H$_2$]×n ⇒ SiO film(SiOCN film base)

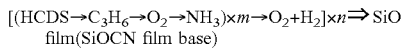
[(HCDS→C$_3$H$_6$→O$_2$→NH$_3$)×m→O$_2$+H$_2$]×n ⇒ SiO film(SiOCN film base)

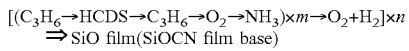
[(C$_3$H$_6$→HCDS→C$_3$H$_6$→O$_2$→NH$_3$)×m→O$_2$+H$_2$]×n ⇒ SiO film(SiOCN film base)

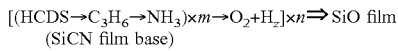
[(HCDS→C$_3$H$_6$→NH$_3$)×m→O$_2$+H$_2$]×n ⇒ SiO film (SiCN film base)

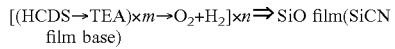
[(HCDS→TEA)×m→O$_2$+H$_2$]×n ⇒ SiO film(SiCN film base)

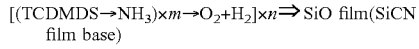
[(TCDMDS→NH$_3$)×m→O$_2$+H$_2$]×n ⇒ SiO film(SiCN film base)

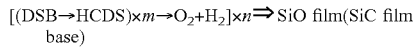
[(DSB→HCDS)×m→O$_2$+H$_2$]×n ⇒ SiO film(SiC film base)

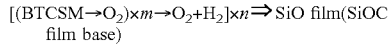
[(BTCSM→O$_2$)×m→O$_2$+H$_2$]×n ⇒ SiO film(SiOC film base)

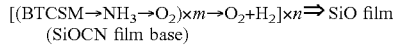
[(BTCSM→NH$_3$→O$_2$)×m→O$_2$+H$_2$]×n ⇒ SiO film (SiOCN film base)

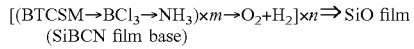
[(BTCSM→BCl$_3$→NH$_3$)×m→O$_2$+H$_2$]×n ⇒ SiO film (SiBCN film base)

(Modifications 34 to 36)

Figure 7:
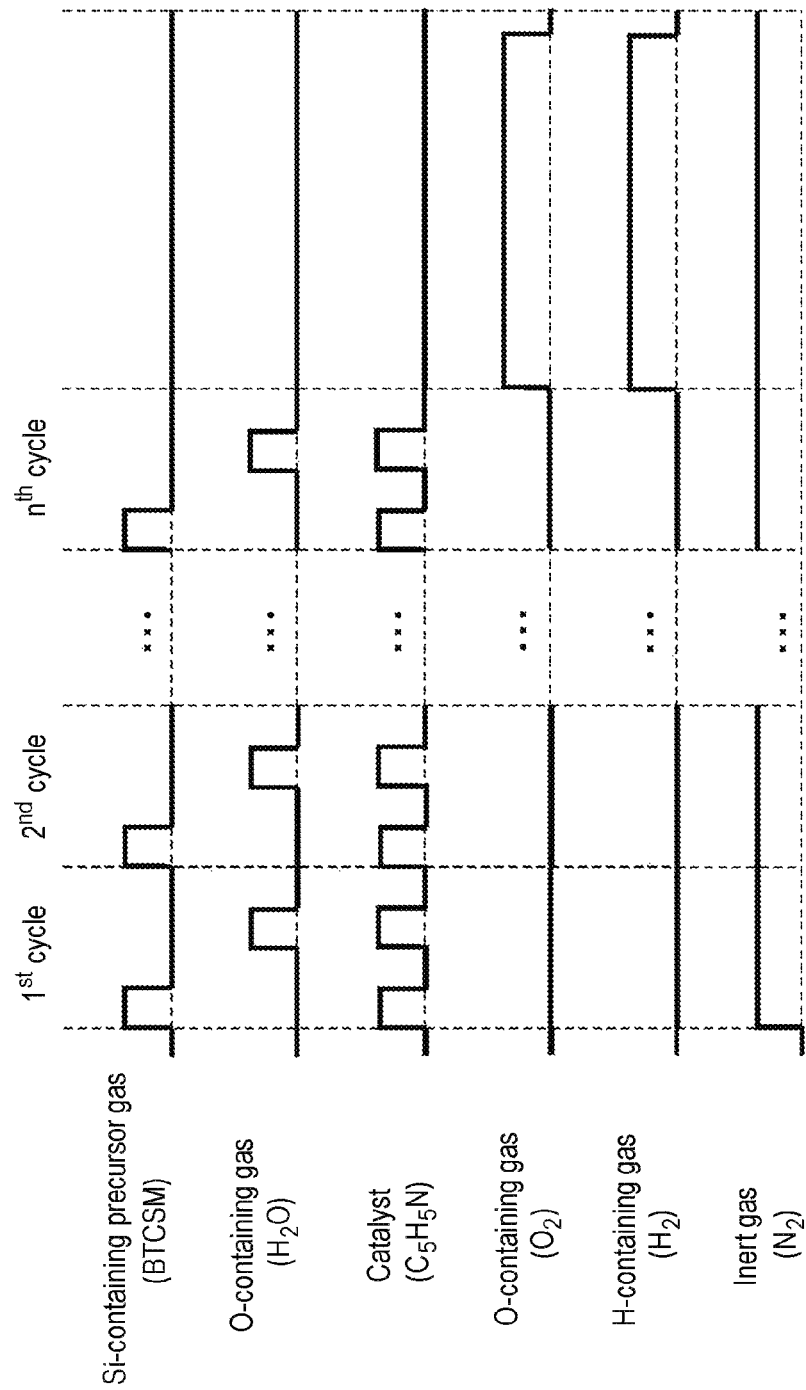
FIG. 7 is a diagram illustrating timing of gas supply in Modification 34 of the film forming sequence according to one embodiment of the present disclosure.

In the base film forming step, a catalyst may be added to the precursor gas or the reaction gas to form a base film containing Si and C in a low temperature range of, e.g., room temperature to 100 degrees C. The catalyst may be supplied from, e.g., the gas supply pipe 232c. Several film forming sequences in a case of using a BTCSM gas as the precursor gas, a H$_2$O gas as the oxidizing gas, and a pyridine (C$_5$H$_5$N) gas, which is a cyclic amine-based gas, as the catalyst are shown below (in order of Modifications 34 to 36). FIG. 7 is a diagram showing a film forming sequence of Modification 34. Even with these modifications, the same effects as the film forming sequence shown in FIG. 4 can be obtained. In addition, since a large amount of impurities such as H$_2$O, C, N, Cl, H and the like are contained in the base film formed by these modifications, the aforementioned effects obtained by modifying the base film can be obtained particularly effectively.

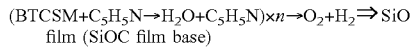
(BTCSM+C$_5$H$_5$N→H$_2$O+C$_5$H$_5$N)×n→O$_2$+H$_2$ ⇒ SiO film (SiOC film base)

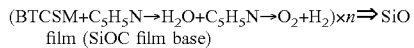
(BTCSM+C$_5$H$_5$N→H$_2$O+C$_5$H$_5$N→O$_2$+H$_2$)×n ⇒ SiO film (SiOC film base)

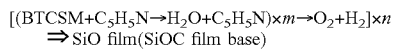
[(BTCSM+C$_5$H$_5$N→H$_2$O+C$_5$H$_5$N)×m→O$_2$+H$_2$]×n ⇒ SiO film(SiOC film base)

(Modification 37)

In the base film modifying step, an O-containing gas having a strong oxidizing power such as an O$_3$ gas may be used as the oxidizing gas. Further, an O-containing gas such as an O$_2$ gas activated by plasma (excited into a plasma state) may be used as the oxidizing gas. In the case where the O-containing gas activated by plasma is used, when supplying the O-containing gas into the process chamber 201 via the gas supply pipe 232b, the nozzle 249b and the buffer chamber 237, high-frequency power may be supplied between the rod-shaped electrodes 269 and 270. Even with these modifications, the same effects as the film forming sequence shown in FIG. 4 can be obtained. In addition, as described above, when the internal temperature of the process chamber 201 is set to 400 degrees C. or higher, the oxidation performed by adding the H$_2$ gas to the O$_2$ gas provides a stronger oxidizing power than O$_3$ oxidation performed at a temperature of 400 degrees C. or higher. In addition, when the internal temperature of the process chamber 201 is set to 450 degrees C. or higher, the oxidation performed by adding the H$_2$ gas to the O$_2$ gas provides a stronger oxidizing power than O$_2$ plasma oxidation performed at a temperature of 450 degrees C. or higher. That is, under these temperature conditions, the oxidation performed by adding the $H_2$ gas to the $O_2$ gas provides a stronger oxidizing power than the $O_3$ oxidation and the $O_2$ plasma oxidation.

(Modification 38)

In the base film modifying step, by lowering the flow rate of the oxidizing gas or lowering the internal temperature and pressure of the process chamber 201, the oxidizing power may be appropriately suppressed and C, N and the like may be left in a film finally formed. That is, some of C and N contained in the base film may be removed, while some may be left. Then, a SiO film containing a predetermined element such as C or N may be formed on the wafer 200. In this case, by using an O-containing gas having a relatively weak oxidizing power such as an $O_2$ gas, a $N_2O$ gas, a NO gas, a $NO_2$ gas, a CO gas, a $CO_2$ gas, a $H_2O$ gas or the like as the oxidizing gas, it is easy to leave C, N and the like in the film finally formed. In addition, in the film forming sequence shown in FIG. 4 and Modifications 1 to 10 and 22 to 33, by increasing the thickness of the base film to be modified by increasing the number of times of repetition of the base layer forming step, it is easy to leave C, N and the like in the film finally formed. However, when C is left in the SiO film, a dielectric constant may be increased and a leak resistance may deteriorate although an etching resistance may be improved. In addition, when N is left in the SiO film, a thermal phosphoric acid resistance may deteriorate. Therefore, the case of forming the SiO film containing C, N and the like may be advantageously applied to a process which does not require such characteristics so much.

(Modifications 39 and 40)

In the film forming sequence shown in FIG. 4 and the aforementioned modifications, an example of forming a base film in a cyclic manner by performing for a predetermined cycle a step of forming a base layer by intermittently supplying plural types of film forming gases to the wafer 200 has been described. However, the present embodiment is not limited thereto. That is, in the base film forming step, the plural types of film forming gases may be simultaneously supplied to the wafer 200. Further, some or all of the plural types of film forming gases may be supplied to the wafer 200 at the same time. Several film forming sequences of these modifications are shown below (in order of Modifications 39 and 40). Even with these modifications, the same effects as the film forming sequence shown in FIG. 4 can be obtained.

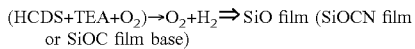
(HCDS+TEA+$O_2$)→$O_2$+$H_2$ ⇒ SiO film (SiOCN film or SiOC film base)

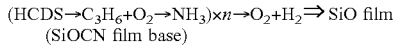
(HCDS→$C_3H_6$+$O_2$→$NH_3$)×n→$O_2$+$H_2$ ⇒ SiO film (SiOCN film base)

(Processing Conditions)

In the aforementioned modifications, in a step of supplying an $NH_3$ gas to the wafer 200, the supply flow rate of the $NH_3$ gas controlled by the MFC 241b is set to fall within a range of, e.g., 100 to 10,000 sccm. Other processing conditions are the same as those in the step 3 of the film forming sequence shown in FIG. 4. As a N-containing gas, in addition to the $NH_3$ gas, it may be possible to use, e.g., a hydrogen nitride-based gas such as a $N_2H_2$ gas, a $N_2H_4$ gas, a $N_3H_8$ gas or the like, a gas containing these compounds, or the like.

In addition, in a step of supplying a $BCl_3$ gas to the wafer 200, the supply flow rate of the $BCl_3$ gas controlled by the MFC 241b is set to fall within a range of, e.g., 100 to 10,000 sccm. Other processing conditions are the same as those in the step 1 of the film forming sequence shown in FIG. 4. As a B-containing gas, in addition to the $BCl_3$ gas, it may be possible to use, e.g., a monochloroborane ($BClH_2$) gas, a dichloroborane ($BCl_2H$) gas, a trifluoroborane ($BF_3$) gas, a tribromoborane ($BBr_3$) gas, a diborane ($B_2H_6$) gas or the like.

In addition, in a step of supplying a $C_3H_6$ gas to the wafer 200, the supply flow rate of the $C_3H_6$ gas controlled by the MFC 241d is set to fall within a range of, e.g., 100 to 10,000 sccm. Other processing conditions are the same as those in the step 2 of the film forming sequence shown in FIG. 4. As a C-containing gas, in addition to the $C_3H_6$ gas, it may be possible to use, e.g., a hydrogen carbide-based gas such as an acetylene ($C_2H_2$) gas, an ethylene ($C_2H_4$) gas or the like.

In addition, in a step of supplying a $C_5H_5N$ gas added to a precursor gas or reaction gas to the wafer 200, the supply flow rate of the pyridine gas controlled by the MFC 241c is set to fall within a range of, e.g., 1 to 2,000 sccm. The internal pressure of the process chamber 201 is set to fall within a range of, e.g., 1 to 2,666 Pa, specifically 67 to 1,333 Pa. The temperature of the heater 207 is set to a temperature such that the temperature of the wafer 200 falls within a range from, e.g., room temperature to 150 degrees C., specifically room temperature to 100 degrees C., more specifically 50 to 100 degrees C. Other processing conditions are the same as those in the step 1 of the base film forming step in the film forming sequence shown in FIG. 4. As a catalyst, in addition to the $C_5H_5N$ gas, it may be possible to use, e.g., a cyclic amine-based gas such as an aminopyridine ($C_5H_6N_2$) gas, a picoline ($C_6H_7N$) gas or a lutidine ($C_7H_9N$) gas, a chain amine-based gas such as a TEA gas, a MEA gas or a TMA gas, a non-amine-based gas such as a $NH_3$ gas, or the like.

In addition, in a step of supplying an O-containing gas such as an $O_2$ gas activated by plasma to the wafer 200, the supply flow rate of the O-containing gas controlled by the MFC 241b is set to fall within a range of, e.g., 100 to 10,000 sccm. The high-frequency power (RF power) applied between the rod-shaped electrodes 269 and 270 is set to fall within a range of, e.g., 50 to 1,000 W. The internal pressure of the process chamber 201 is set to fall within a range of, e.g., 1 to 500 Pa, specifically 1 to 100 Pa. The partial pressure of the O-containing gas in the process chamber 201 is set to fall within a range of, e.g., 0.01 to 495 Pa, specifically 0.01 to 99 Pa. By using plasma, it is possible to activate the O-containing gas even if the internal pressure of the process chamber 201 is in such a relatively low pressure zone. Other processing conditions are the same as those in the base film modifying step in the film forming sequence shown in FIG. 4.

The processing procedures and processing conditions in other steps may be the same as those in each step in the film forming sequence shown in FIG. 4.

<Other Embodiments of the Present Disclosure>

While some embodiments of the present disclosure have been specifically described above, the present disclosure is not limited to the aforementioned embodiments but may be differently modified without departing from the subject matter of the present disclosure.

For example, in the aforementioned embodiments, an example in which the base film forming step and the base film modifying step are continuously performed in the same process chamber has been described. However, the present disclosure is not limited thereto. For example, in the film forming sequence shown in FIG. 4 and Modifications 1 to 11, the base film forming step may be performed in a first process chamber and the base film modifying step may be performed in a second process chamber different from the first process chamber. That is, these two steps may be not only performed in-situ using the substrate processing apparatus shown in FIG. 1, but also may be performed ex-situ using a substrate processing system including a first substrate processing part for performing the base film forming step and a second substrate processing part for performing the base film modifying step. The substrate processing system is not limited to a case where the first substrate processing part and the second substrate processing part are configured as a group of independent devices (stand-alone type devices) but may be configured as a single device (cluster type device) in which the first substrate processing part and the second substrate processing part are mounted on the same platform.

Further, for example, in the aforementioned embodiments, an example in which the base film is formed by first supplying a precursor gas and then supplying a reaction gas has been described. However, the present disclosure is not limited thereto but the supply order of the precursor gas and the reaction gas may be reversed. That is, the reaction gas may be first supplied and then the precursor gas may be supplied. By changing the supply order, it is possible to change the film quality and composition ratio of a film to be formed. Further, when plural types of reaction gases are used, the supply order may be arbitrarily changed. By changing the supply order of the reaction gases, it is possible to change the film quality and composition ratio of a film to be formed.

By using a silicon-based insulating film formed by the film forming sequence shown in FIG. 4 and each modification as a sidewall spacer, it is possible to provide a device forming technique with less leakage current and excellent workability. In addition, by using the silicon-based insulating film as an etch stopper, it is possible to provide a device forming technique with excellent workability. In addition, according to the film forming sequence shown in FIG. 4 and some modifications, it is possible to form a silicon-based insulating film having an ideal stoichiometric ratio without using plasma. Since the silicon-based insulating film can be formed without using plasma, it is possible to adopt this technique for a process concerned about plasma damage, such as forming an SADP film of DPT.

In these cases, the processing conditions are the same as those of the aforementioned embodiments.

The aforementioned film forming sequence can be suitably applied to a case of forming a C-free metal film containing a metal element such as titanium (Ti), zirconium (Zr), hafnium (Hf), tantalum (Ta), niobium (Nb), aluminum (Al), molybdenum (Mo), tungsten (W) or the like on the wafer 200.

Specifically, the present disclosure can be applied to a case of forming a metal-based base film containing C, such as a TiC film, a TiCN film, a TiOCN film, a TiOC film, a TiBCN film, a ZrC film, a ZrCN film, a ZrOCN film, a ZrOC film, a ZrBCN film, a HfC film, a HfCN film, a HfOCN film, a HfOC film, a HfOCN film, a TaC film, a TaCN film, a TaOCN film, a TaOC film, a TaBCN film, a NbC film, a NbCN film, a NbOCN film, a NbOC film, a NbBCN film, an AlC film, an AlCN film, an AlOCN film, an AlOC film, an AlBCN film, a MoC film, a MoCN film, a MoOCN film, a MoOC film, a MoBCN film, a MFC film, a MFCN film, a WOCN film, a WOC film, a WBCN film or the like and forming a C-free metal-based oxide film by oxidizing and modifying the metal-based base film containing C.

In these cases, as a precursor gas, it may be possible to use a precursor gas containing a metal element instead of the precursor gas containing Si in the aforementioned embodiments. As a reaction gas and a modifying gas, it may be possible to use the same gases as in the aforementioned embodiments. The processing procedures and processing conditions at this time may be the same as those in the aforementioned embodiments.

That is, the present disclosure can be appropriately applied to a case of forming a C-free oxide film containing a predetermined element such as a semiconductor element, a metal element or the like.

Process recipes (programs describing substrate processing procedures and processing conditions) used to form these various films may be prepared individually (in plural) according to the substrate processing contents (the kind, composition ratio, quality, film thickness, processing procedure, processing condition and so on of a film to be formed). Then, at the start of the substrate processing, an appropriate recipe may be properly selected from the recipes according to the substrate processing contents. Specifically, the plurality of recipes individually prepared according to the substrate processing contents may be previously stored (installed) in the memory device 121c provided in the substrate processing apparatus via an electrical communication line or a recording medium (e.g., the external memory device 123) in which the recipes are recorded. Then, when the substrate processing is initiated, the CPU 121a provided in the substrate processing apparatus may appropriately select an appropriate recipe from the plurality of recipes stored in the memory device 121c according to the substrate processing contents. With this configuration, thin films having a variety of film types, composition ratios, film qualities and film thicknesses can be formed with high versatility and high reproducibility in a single substrate processing apparatus. In addition, it is possible to reduce an operator's burden (e.g., a burden borne by an operator when inputting processing procedures and processing conditions) and to quickly start the substrate processing while avoiding an operation error.

The process recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using a substrate processing apparatus provided with a hot-wall-type processing furnace. The present disclosure is not limited to the aforementioned embodiments but may be appropriately applied to a case where films are formed using a substrate processing apparatus provided with a cold-wall-type processing furnace. Even in these cases, the processing procedures and processing conditions may be the same as those in the aforementioned embodiments.

Figure 10:
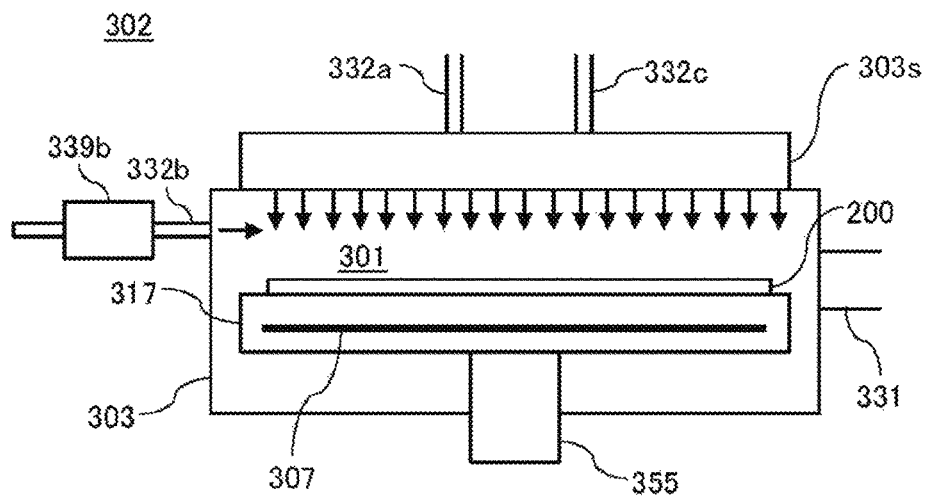
FIG. 10 is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 10. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332a for supplying the aforementioned precursor gas and a gas supply port 332c for supplying the aforementioned H-containing gas are connected to inlets (gas introduction holes) of the shower head 303s. A gas supply port 332b as a gas supply part for supplying the aforementioned reaction gas is connected to the side wall of the process vessel 303, that is, the lateral side of the end portions of the wafers 200 carried into the process chamber 301. A gas supply system similar to the precursor gas supply system of the aforementioned embodiments is connected to the gas supply port 332a. A gas supply system similar to the H-containing gas supply system of the aforementioned embodiments is connected to the gas supply port 332c. A remote plasma unit (or a plasma generating device) 339b as an exciting part configured to excite the aforementioned reaction gas by plasma and a gas supply system similar to the reaction gas supply system of the aforementioned embodiments are connected to the gas supply port 332b. A gas distribution plate configured to supply a gas into the process chamber 301 in a shower-like manner is installed in outlets (gas discharge holes) of the shower head 303s. The shower head 303s is installed at such a position as to face the surfaces of the wafers 200 carried into the process chamber 301. The gas supply port 332b is installed at such a position as not to face the surfaces of the wafers 200 carried into the process chamber 301. An exhaust port 331 configured to evacuate the interior of the process chamber 301 is installed in the process vessel 303. An exhaust system similar to the exhaust systems of the aforementioned embodiments is connected to the exhaust port 331.

Figure 11:
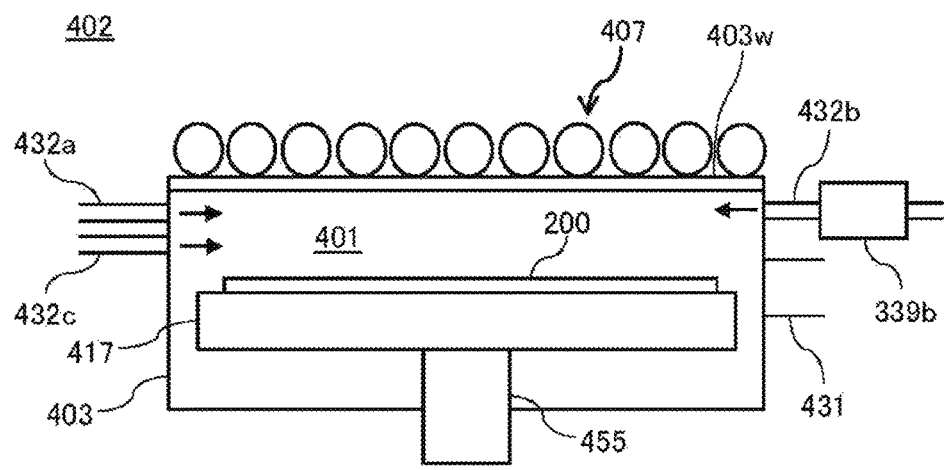
FIG. 11 is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 11. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. A gas supply port 432a for supplying the aforementioned precursor gas, a gas supply port 432b as a gas supply part for supplying the aforementioned reaction gas, and a gas supply port 432c as a gas supply part for supplying the aforementioned H-containing gas are connected to the process vessel 403. A gas supply system similar to the precursor gas supply system of the aforementioned embodiments is connected to the gas supply port 432a. The aforementioned remote plasma unit 339b and a gas supply system similar to the reaction gas supply system of the aforementioned embodiments are connected to the gas supply port 432b. A gas supply system similar to the H-containing gas supply system of the aforementioned embodiments is connected to the gas supply port 432c. The gas supply ports 432a to 432c are respectively installed at the lateral side of the end portions of the wafers 200 carried into the process chamber 401, namely at such positions as not to face the surfaces of the wafers 200 carried into the process chamber 401. An exhaust port 431 configured to evacuate the interior of the process chamber 401 is installed in the process vessel 403. An exhaust system similar to the exhaust systems of the aforementioned embodiments is connected to the exhaust port 431.

In the case of using these substrate processing apparatuses, film formation may be performed according to the same processing procedures and processing conditions as those in the aforementioned embodiments.

The aforementioned embodiments may be used in proper combination. In addition, the processing procedures and processing conditions used at this time may be the same as those of the aforementioned embodiments.

EXAMPLE

As an Example, a SiO film was formed on a wafer by the film forming sequence shown in FIG. 4 using the substrate processing apparatus in the aforementioned embodiments. An HCDS gas, a TEA gas, and an $O_2$ gas were used as film forming gases and an $O_2$ gas and a $H_2$ gas were used as modifying gases. The temperatures of the wafer in the base film forming step and the base film modifying step were both set to a predetermined temperature (the same temperature) within a range of 550 to 650 degrees C. Other processing conditions were set to be within the processing conditions range described in the aforementioned embodiments.

As a Comparative Example, using the substrate processing apparatus in the aforementioned embodiments, a SiO film was formed on the wafer according to a film forming sequence in which a step of forming a C-free base film by supplying an HCDS gas to the wafer in the process chamber and a step of oxidizing the C-free base film by using an $O_2$ gas and a $H_2$ gas to be modified into a C-free oxide film were alternately performed a predetermined number of times. The processing conditions were the same as those in the Example.

Then, composition and etching resistance were evaluated for the base film in the Example, the SiO film in the Example, and the SiO film in the Comparative Example. Measurement results are shown in FIGS. 8 and 9.

Figure 8:
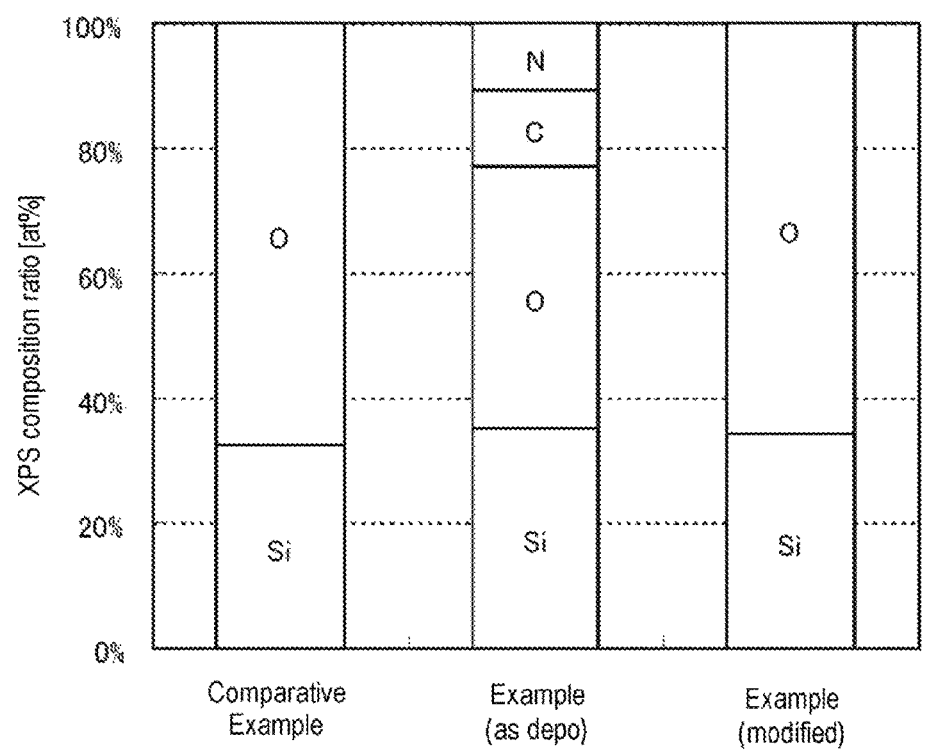
FIG. 8 is a view showing results of XPS measurement of an oxide film in an Example.

FIG. 8 is a diagram showing compositions of the base film in the Example, the SiO film in the Example, and the SiO film in the Comparative Example. The horizontal axis in FIG. 8 represents the SiO film in the Comparative Example, the base film (as depo) in the Example, and the SiO film (modified) in the Example in this order. The vertical axis in FIG. 8 represents the Si, O, C and N concentrations [at %] in the film measured by XPS. It can be seen from FIG. 8 that C and N are desorbed from the film for the SiO film in the Example, compared to the base film in the Example, and the SiO film in the Example has the same composition as the SiO film in the Comparative Example. That is, even when a base film containing C is formed as in the Example, by performing a modifying process using the $O_2$ gas and the $H_2$ gas thereafter, it can be seen that a film having a low impurity concentration is obtained like the Comparative Example in which a C-free base film is formed and modified.

Figure 9:
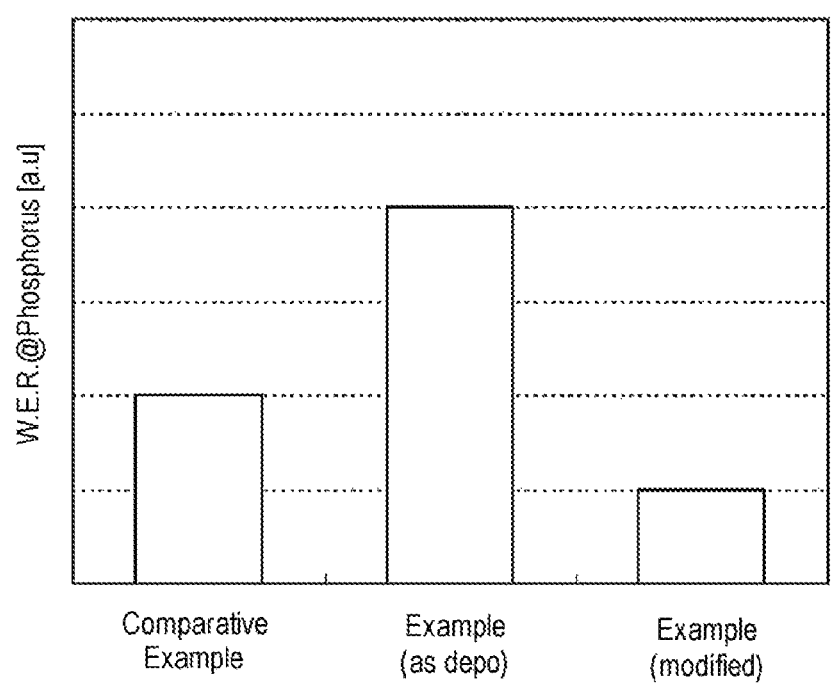
FIG. 9 is a view showing results of measurement of thermal phosphoric acid resistance of the oxide film in the Example.

FIG. 9 is a diagram showing etching resistances of the base film in the Example, the SiO film in the Example, and the SiO film in the Comparative Example. The horizontal axis in FIG. 9 represents the SiO film in the Comparative Example, the base film (as depo) in the Example, and the SiO film (modified) in the Example in this order. The vertical axis in FIG. 9 represents the wet etching rate (hereinafter also referred to as WER) in arbitrary units when a film is etched with a thermal phosphoric acid. It can be seen from FIG. 9 that the SiO film in the Example can reduce the WER to about ¼ of that of the base film in the Example. That is, it can be seen that the base film can be modified into a robust SiO film with a high etching resistance by performing the aforementioned modifying process on the C-containing base film. Further, it can be seen from FIG. 9 that the SiO film in the Example can reduce the WER to about ½ of that of the SiO film in the Comparative Example. That is, by forming and modifying the C-containing base film as in the Example, it can be seen that it is possible to form a stronger film with a higher etching resistance than the C-free base film formed and modified as in the Comparative Example.

According to the present disclosure in some embodiments, it is possible to form an oxide film with a low impurity concentration and an excellent etching resistance.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a base film containing a first element, carbon, and oxygen on a substrate by performing a cycle a predetermined number of times, the cycle including performing:
        forming a layer containing the first element, carbon and chlorine on the substrate by supplying a film forming gas containing chlorine to the substrate; and
        oxidizing the layer containing the first element, carbon and chlorine by supplying a first oxidizing gas to the substrate; and
    modifying the base film into a C-free oxide film containing the first element by supplying a second oxidizing gas to the substrate, which is heated, under an atmosphere of pressure lower than atmospheric pressure and oxidizing the base film,
    wherein the second oxidizing gas, which is different from the first oxidizing gas, includes an oxygen-containing gas and a hydrogen-containing gas.

2. The method of claim 1, wherein the base film further contains a second element different from the first element.

3. The method of claim 2, wherein the first element includes at least one selected from a group consisting of a semiconductor element and a metal element, and the second element is nitrogen.

4. The method of claim 3, wherein the oxide film does not contain nitrogen.

5. The method of claim 1, wherein the base film includes at least one selected from a group consisting of a SiOCN film and a SiOC film, and the oxide film includes a SiO film.

6. The method of claim 1, wherein the act of forming the base film and the act of oxidizing the base film are alternately repeated.

7. The method of claim 1, wherein a cycle including the act of forming the layer containing the first element, carbon and chlorine and the act of oxidizing the layer containing the first element, carbon and chlorine is performed one time in the act of forming the base film.

8. The method of claim 1, wherein a cycle including the act of forming the layer containing the first element, carbon and chlorine and the act of oxidizing the layer containing the first element, carbon and chlorine is performed for a plurality of times in the act of forming the base film.

9. The method of claim 1, wherein the second oxidizing gas is supplied to the substrate under a non-plasma atmosphere in the act of oxidizing the base film.

10. The method of claim 1, wherein carbon is extracted from the base film by causing the base film and the second oxidizing gas to react with each other in the act of oxidizing the base film.

11. The method of claim 1, wherein carbon and nitrogen are extracted from the base film by causing the base film and the second oxidizing gas to react with each other in the act of oxidizing the base film.

12. The method of claim 1, wherein a cycle including supplying a gas containing the first element and chlorine to the substrate and supplying a gas containing carbon to the substrate is performed a predetermined number of times in the act of forming the layer containing the first element, carbon and chlorine.

13. The method of claim 1, wherein chlorine is at least partly extracted from the layer containing the first element, carbon and chlorine in the act of oxidizing the layer containing the first element, carbon and chlorine.

* * * * *